US008848588B2

(12) United States Patent
Connors et al.

(10) Patent No.: US 8,848,588 B2
(45) Date of Patent: Sep. 30, 2014

(54) NETWORK ENTRY AND RECOVERY

(75) Inventors: Dennis Connors, San Diego, CA (US); Sina Zahedi, San Diego, CA (US); Yoav Nebat, San Diego, CA (US)

(73) Assignee: WI-LAN, Inc., Ottawa (CA)

( * ) Notice: Subject to any disclaimer, the term of this patent is extended or adjusted under 35 U.S.C. 154(b) by 1097 days.

(21) Appl. No.: 12/202,182

(22) Filed: Aug. 29, 2008

(65) Prior Publication Data
US 2009/0147877 A1 Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.
*H04W 4/06* (2009.01)
*H03M 13/09* (2006.01)
*H04W 72/00* (2009.01)
*H04L 1/00* (2006.01)

(52) U.S. Cl.
CPC .......... *H03M 13/09* (2013.01); *H04W 72/005* (2013.01); *H04L 1/0084* (2013.01)
USPC ....................................... 370/312; 370/336

(58) Field of Classification Search
USPC ......... 370/312, 328, 343, 344, 389, 390, 329, 370/336, 340, 341, 345
See application file for complete search history.

(56) References Cited

U.S. PATENT DOCUMENTS

| | | | |
|---|---|---|---|
| 5,546,409 | A | 8/1996 | Karasawa |
| 5,826,018 | A | 10/1998 | Vixie et al. |
| 5,983,383 | A | 11/1999 | Wolf |
| 6,021,433 | A | 2/2000 | Payne et al. |

(Continued)

FOREIGN PATENT DOCUMENTS

| | | |
|---|---|---|
| EP | 1 718 096 | 11/2006 |
| KR | 10-1995-0010768 | 9/1995 |

(Continued)

OTHER PUBLICATIONS

FORM PCT/ISA/220, Notification of Transmittal of the International Search Report and the Written Opinion of the International Seraching Authority, or the Declaration, mailed May 26, 2009 for corresponding PCT Application PCT/2008/086278.

(Continued)

*Primary Examiner* — Michael Thier
*Assistant Examiner* — Feben M Haile
(74) *Attorney, Agent, or Firm* — Volpe and Koenig, P.C.

(57) ABSTRACT

The subject matter disclosed herein provides a network entry and recovery mechanism using a map. In one aspect, there is provided a method. The method may insert a plurality of packets into a plurality of data regions. A map may be inserted into one of the data regions. The map may include information to enable decoding of the plurality of data regions, a location of other maps within the plurality of data regions, and a size of the map. The plurality of data regions may be provided to enable the plurality of data regions to be transmitted to one or more client stations. Related systems, apparatus, methods, and/or articles are also described.

20 Claims, 16 Drawing Sheets

(56) References Cited

U.S. PATENT DOCUMENTS

| | | | |
|---|---|---|---|
| 6,085,253 | A | 7/2000 | Blackwell et al. |
| 6,928,521 | B1 | 8/2005 | Burton et al. |
| 7,031,249 | B2 | 4/2006 | Kowalski |
| 7,058,027 | B1 | 6/2006 | Alessi et al. |
| 7,343,540 | B2 | 3/2008 | Khermosh et al. |
| 7,464,319 | B2 | 12/2008 | Budge et al. |
| 7,644,343 | B2 | 1/2010 | Gubbi et al. |
| 7,660,245 | B1 | 2/2010 | Luby |
| 7,856,026 | B1 | 12/2010 | Finan et al. |
| 7,877,663 | B2 | 1/2011 | Vesma et al. |
| 8,095,856 | B2 | 1/2012 | Wang |
| 2002/0147954 | A1 | 10/2002 | Shea |
| 2003/0081564 | A1 | 5/2003 | Chan |
| 2003/0207696 | A1 | 11/2003 | Willenegger et al. |
| 2003/0226092 | A1 | 12/2003 | Kim et al. |
| 2004/0090932 | A1 | 5/2004 | Wei et al. |
| 2004/0100937 | A1 | 5/2004 | Chen |
| 2004/0199847 | A1 | 10/2004 | Calabro et al. |
| 2004/0199850 | A1 | 10/2004 | Yi et al. |
| 2004/0237024 | A1 | 11/2004 | Limberg |
| 2004/0243913 | A1 | 12/2004 | Budge et al. |
| 2005/0005189 | A1 | 1/2005 | Khermosh et al. |
| 2005/0088986 | A1 | 4/2005 | Sun et al. |
| 2005/0135308 | A1 | 6/2005 | Vijayan et al. |
| 2005/0265168 | A1 | 12/2005 | Kopf |
| 2006/0013168 | A1 | 1/2006 | Agrawal et al. |
| 2006/0077890 | A1 | 4/2006 | Suryavanshi et al. |
| 2006/0239264 | A1* | 10/2006 | Kang et al. ............ 370/390 |
| 2006/0239265 | A1* | 10/2006 | Son et al. ............ 370/390 |
| 2006/0248430 | A1 | 11/2006 | Iancu et al. |
| 2006/0268726 | A1 | 11/2006 | Alamaunu et al. |
| 2007/0004437 | A1 | 1/2007 | Harada et al. |
| 2007/0019717 | A1 | 1/2007 | Laroia et al. |
| 2007/0101228 | A1 | 5/2007 | Vesma et al. |
| 2007/0165578 | A1 | 7/2007 | Yee et al. |
| 2007/0186143 | A1 | 8/2007 | Gubbi et al. |
| 2007/0230351 | A1 | 10/2007 | Dang |
| 2007/0240027 | A1 | 10/2007 | Vesma et al. |
| 2007/0253367 | A1 | 11/2007 | Dang et al. |
| 2007/0268933 | A1 | 11/2007 | Wu et al. |
| 2008/0022345 | A1 | 1/2008 | Kim et al. |
| 2008/0052605 | A1 | 2/2008 | Luo et al. |
| 2008/0056219 | A1* | 3/2008 | Venkatachalam ............ 370/342 |
| 2008/0062872 | A1 | 3/2008 | Christiaens et al. |
| 2008/0080474 | A1 | 4/2008 | Kitchin |
| 2008/0098283 | A1 | 4/2008 | Vayanos et al. |
| 2008/0114711 | A1 | 5/2008 | Nagaraj |
| 2008/0225819 | A1 | 9/2008 | Niu et al. |
| 2008/0282310 | A1 | 11/2008 | Koppelaar et al. |
| 2009/0034459 | A1 | 2/2009 | Shousterman et al. |
| 2009/0055715 | A1 | 2/2009 | Jashek et al. |
| 2009/0109890 | A1* | 4/2009 | Chow et al. ............ 370/312 |
| 2009/0150736 | A1 | 6/2009 | Nebat et al. |
| 2009/0177940 | A1 | 7/2009 | Guo et al. |
| 2009/0259920 | A1 | 10/2009 | Guo et al. |
| 2010/0115379 | A1 | 5/2010 | Gubbi et al. |
| 2010/0138727 | A1 | 6/2010 | Song et al. |
| 2010/0183077 | A1 | 7/2010 | Lee et al. |
| 2010/0211850 | A1 | 8/2010 | Song et al. |
| 2011/0235724 | A1 | 9/2011 | Kim et al. |
| 2012/0079356 | A1 | 3/2012 | Choi et al. |

FOREIGN PATENT DOCUMENTS

| | | |
|---|---|---|
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 2005/022814 | 3/2005 |
| WO | WO 2005/022814 | 3/2005 |

OTHER PUBLICATIONS

QUALCOMM, "MBMS design consideration," 3GPP TSG WGIT, R102-1099 (Jan. 7-10, 2003).
Form PCT/ISA/220, Notification of Transmittal of the International Search Report and the Written Opinion of the International Searching Authority, or the Declaration, Apr. 30, 2009.
Agashe, Parag et al., "CDMA2000 High Rate Broadcast Packet Data Air Interface Design", IEEE Comm. Magazine, pp. 83-89, Feb. 2004.
3GPP TSG WGITdoc R1-02-1099, "MBMS design consideration", Qualcimm, Seattle, USA, Jan. 7-10, 2003.
IEE 802.16 Broadband Wireless Access Working Group, IEEE 802.161pc-00/33, "FEC Performance of Concatenated Reed Solomon and Convolutional Coding with Interleaving", Jun. 8, 2000.
IEE 802.16 Broadband Wireless Access Working Group, IEEE 802.161maint-08/293, "Optional outer-coded data mode for MBS", Sep. 11, 2008.
Form PCT/ISA/220, Notification of Transmittal of the International Search Report and the Written Opinion of the International Searching Authority, or the Declaration, Apr. 20, 2009.
FORM PCT/ISA/220, Notification of Transmittal of the International Search Report and the Written Opinion of the International Searching Auhority, or the Declaration, mailed May 18, 2009.
FORM PCT/ISA/220, Notification of Transmittal of the International Search Report and the Written Opinion of the International Searching Auhority, or the Declaration, mailed Apr. 30, 2009.
FORM PCT/ISA/220, Notification of Transmittal of the International Search Report and the Written Opinion of the International Seaching Authority, or th Declaration, mailed May 26, 2009.
IEEE 802.16 Broadband Wireless Access Working Group, IEEE 802.161pc-00/33, "FEC Performance of Concatenated Reed Solomon and Convolutional Coding with Interleaving," (Jun. 8, 2000).
Jenkac et al., "Flexible outer Reed-Solomon coding on RLC layer for MBMS over GERAN," Vehicular Technology Conference. vol. 5, pp. 2777-2781 (May 2004).
Agashe et al., "CDMA2000 High Rate Broadcast Packet Data Air Interface Design," IEEE Comm. Magazine, pp. 83-89 (Feb. 2004).
FORM PCT/ISA/220, Notification of Transmittal of the International Search Report and the Written Opinion of the International Searching Authority, or the Declaration, mailed May 18, 2009.
FORM PCT/ISA/220, Notification of Transmittal of the International Search Report and the Written Opinion of the International Searching Authority, or the Declaration, mailed Apr. 30, 2009.
FORM PCT/ISA/220, Notification of Transmittal of the International Search Report and the Written Opinion of the International Searching Authority, or the Declaration, mailed Apr. 20, 2009.
FORM PCT/ISA/220, Notification of Transmittal of the International Search Report and the Written Opinion of the International Searching Authority, or the Declaration, mailed May 26, 2009.
FORM PCT/ISA/220, Notification of Transmittal of the International Search Report and the Written Opinion of the International Searching Authority, or the Declaration, mailed Jun. 24, 2009 for corresponding PCT Application PCT/US2008/086103.
FORM PCT/ISA/220, Notification of Transmittal of the International Search Report and the Written Opinion of the International Searching Authority, or the Declaration, mailed May 26, 2009 for corresponding PCT Application PCT/US2008/086278.
IEEE 802.16 Broadband Wireless Access Working Group, IEEE 802.161pc-00/33, "FEC Performance of Concatenated Reed Solomon and Convolutional Coding with Interleaving," (Jun. 8. 2000).
IEEE 802.16 Broadband Wireless Access Working Group, IEEE 802.161maint-08/293, "Optional outer-coded data mode for MBS," (Sep. 11, 2008).
Jenkac et al., "Flexible outer Reed-Solomon coding on RLC layer for MBMS over GERAN," Vehicular Technology Conference, vol. 5, pp. 2777-2781 (May 2004).
Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

(56) References Cited

OTHER PUBLICATIONS

Pursley et al., "Variable-Rate Coding for Meteor-Burst Communications," IEEE Trans. On Comm., vol. 37, No. 11 (Nov. 1989).
QUALCOMM, "MBMS design consideration," 3GPP TSG WGIT, R1-02-1099 (Jan. 7-10, 2003).
Wang et al., "System Architecture and Cross-Layer Optimization of Video Broadcast over WiMAX," IEEE Journal on Selected Areas in Communications, vol. 25, No. 4 pp. 712-721 (May 2007).
Wei et al., "Application of NB/WB AMR Speech Codes in the 30-kHz TDMA System," IEEE Trans. On Comm., vol. 6, No. 6 (Nov. 2004).

* cited by examiner

NETWORK ENTRY AND RECOVERY

CROSS REFERENCE TO RELATED APPLICATION

This application claims the benefit under 35 U.S.C.§119(e) of the following provisional applications, all of which are incorporated herein by reference in their entirety: U.S. Ser. No. 61/007,360, entitled "Multimedia Broadcast System," filed Dec. 11, 2007;U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008;and U.S. Ser. No. 61/060,117, entitled "Multimedia Broadcast System," filed Jun. 9, 2008.

FIELD

The subject matter described herein relates to wireless communications.

BACKGROUND

Multicasting and broadcasting refers generally to sending information to a plurality of receivers. In multicasting and/or broadcasting data, a system may use macrodiversity, which refers to a type of transmission in which a plurality of base stations synchronously transmit the data over the same frequency, using the same waveform, and using about the same framing parameters. A network employing macrodiversity is sometimes referred to as a single frequency network (SFN).

At a receiver, such as a client station, the macrodiversity may be exploited by the receiver. For example, the multiple versions of the same signal received from the multiple base stations may be combined to produce a signal with improved signal strength at the receiver. The gain achieved by combining these multiple versions of the same signal is often referred to as "macrodiversity gain."

One standard that supports the multicasting and/or broadcasting of data is IEEE 802.16. As used herein, IEEE 802.16 refers to one or more specifications, such as the Institute of Electrical and Electronic Engineers (IEEE) Standard for Local and metropolitan area networks, Part 16: Air Interface for Fixed Broadband Wireless Access Systems, 1 Oct. 2004, the IEEE Standard for Local and metropolitan area networks, Part 16: Air Interface for Fixed and Mobile Broadband Wireless Access Systems, 26 Feb. 2006, and subsequent revisions and additions to those standards. Pursuant to IEEE 802.16, multicast and/or broadcast data may be transmitted to client stations using a region of an Orthogonal Frequency Division Multiple Access (OFDMA) data frame referred to as the Multicast and Broadcast Services (MBS) region.

FIG. 9 depicts an example of OFDMA frames 910A-D used in connection with an MBS transmission consistent with IEEE 802.16. The OFDMA frames 910A-D includes data regions, such as MBS regions 912A-D, transmitted in a downlink from a base station to a client station. These data regions represent one or more OFDMA symbols (or simply symbols) carrying the content (e.g., packets) of the multicast and broadcast service. When macrodiversity is used, each of the base stations synchronously transmit an MBS region using about the same waveform, at the about same frequency, and at about the same time (e.g., the first symbol of an MBS region is transmitted at about the same time at each of the base stations). In accordance with IEEE 802.16, each of the MBS regions 912A-D is described by an MBS MAP 914A-D, so that an MBS MAP describes an MBS region. The size and location of the MBS regions and the composition of the MBS MAPs is described in downlink (DL) MAPs 916A-D and, more particularly, in messages (also referred to as "information elements") included within some of the downlink MAPs 916A-D. These information elements are referred to in IEEE 802.16 as an "MBS MAP IE". This information from the DL-MAP may be used by the client station to decode one or more of the MBS MAPs 914A-D, which describes how to decode (e.g., receive, demodulate, correct for errors, and the like) a corresponding MBS region 912A-D.

SUMMARY

The subject matter disclosed herein provides a network entry and recovery mechanism using a map.

In one aspect, there is provided a method. The method may include inserting a plurality of packets into a plurality of data regions; inserting, into one of the data regions of the plurality of data regions, a map, the map including information to enable decoding of another map and decoding another one of the plurality of data regions; and providing the plurality of data regions to enable the plurality of data regions to be transmitted to one or more client stations.

In another aspect, there is provided a method. The method may include inserting a plurality of packets into a plurality of data regions; inserting, into one of the data regions of the plurality of data regions, a message including a common message and one or more stream messages, the common message associated with the one or more stream messages to enable accessing one of the stream messages by accessing the common message without accessing the other stream messages; and providing the one data region including the message for transmission to one or more client stations.

In yet another aspect, there is provided a method. The method may include receiving, at a client station, a plurality of data regions; receiving a message in one of the data regions, the message configured to include a common message and one or more stream messages, the common message associated with the one or more stream messages to enable accessing one of the stream messages by accessing the common message without accessing the other stream messages; and decoding, using the accessed stream message, at least one stream transmitted in a data region other than the one data region including the message.

In another aspect there is provided a method. The method may include receiving, a packet in a substream of a stream of packets, the packet including an embedded MAP, the embedded MAP configuring a client station to decode the stream of packets in a data region other than the one data region including the packet; and decoding, based on the received packet, packets and the stream of packets in the other data region.

In another aspect there is provided a method. The method may include receiving a stream of packets for insertion into a data structure to be encoded using an outer code; receiving pattern information and packet boundary information, the pattern information representative of a pattern used to write the stream of packets into the data structure and the packet boundary information representative of start locations of packets in the data structure; generating, based on the pattern information and the packet boundary information, a message; and inserting the generated message into the data structure as one or more packets in the data structure.

In an aspect there is provided a method. The method may include receiving a message inserted as one or more initial packets of a data structure decoded at a client station; accessing, based on the received message, a stream of packets of the data structure, the message including pattern information and packet boundary information, the pattern information representative of a pattern used to write the stream of packets into the data structure and the packet boundary information representative of start locations of packets in the data structure; and providing the accessed stream of packets.

Moreover, one or more of the above note aspects and features may be embodied as a computer-readable medium (e.g., a computer-readable medium containing instructions to configure a processor to perform a method noted herein). In addition, one or more of the above note aspects and features may be embodied as a system (e.g., a system comprising at least one processor and at least one memory, wherein the at least one processor and the at least one memory are configured to provide a method noted herein).

The details of one or more variations of the subject matter described herein are set forth in the accompanying drawings and the description below. Features and advantages of the subject matter described herein will be apparent from the description and drawings, and from the claims.

Figure 1:
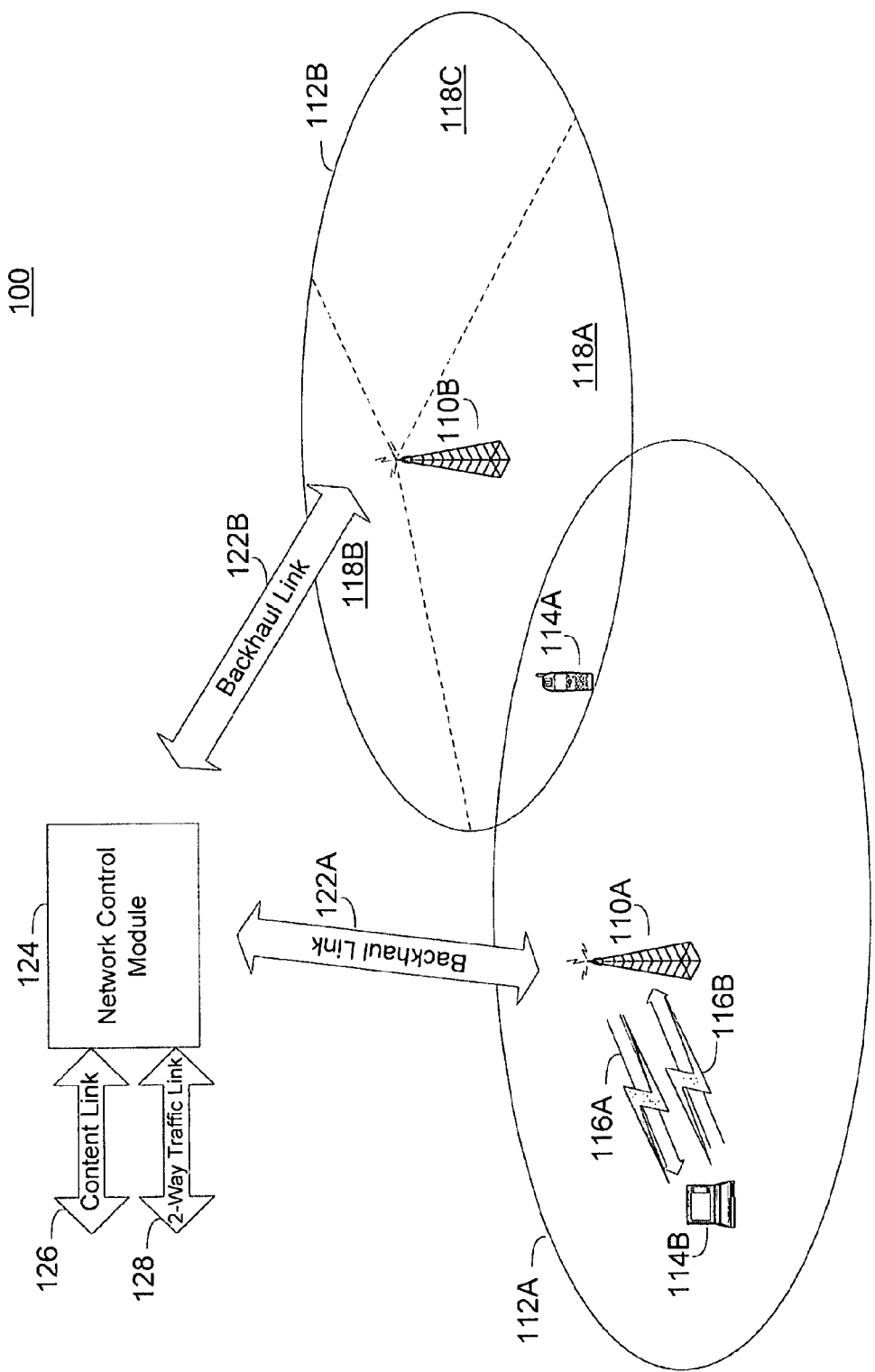
FIG. 1 depicts a block diagram of a network including client stations and base stations.

Like labels are used to refer to same or similar items in the drawings.

DETAILED DESCRIPTION

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter-reading equipment, or the like and may include a display mechanism, microphone, speaker, and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as subchannels or tones). The subcarriers are modulated using BPSK (binary phase shift keying), QPSK (quadrature phase shift keying), QAM (quadrature amplitude modulation), and carry OFDMA symbols (or symbols) including data coded using a forward error-correction code.

The following described embodiments relate to MAPs used for defining a data region of a data frame. This data region may be, for example, a data region useable for multicasting and/or broadcasting data to client stations. Moreover, the MAPs may be used by a receiver, such as a client station, during network entry and/or recovery. Although the below described embodiments will be described in the context of an MBS region in accordance with IEEE 802.16 as modified by the teachings herein, it should be understood this is exemplary only. For example, in other embodiments other data regions may be used, such as data regions in accordance with other standards, such as for example, data regions in accordance with Long Term Evolution (LTE), or other standards. LTE defines a multicasting and broadcasting service, referred to as Multimedia Broadcast and Multicast Service (MBMS) in which a data region is used for multicasting and/or broadcasting data to client stations. To support MBMS, LTE offers the possibility to multicast/broadcast data over a single frequency network (referred to as MBSFN) using a time synchronized common waveform transmitted from multiple base stations for a given time interval. Accordingly, it should be understood that in other embodiments, the MAPs may be useable for defining how the multicast/broadcast data is transmitted during such time intervals.

Figure 2A:
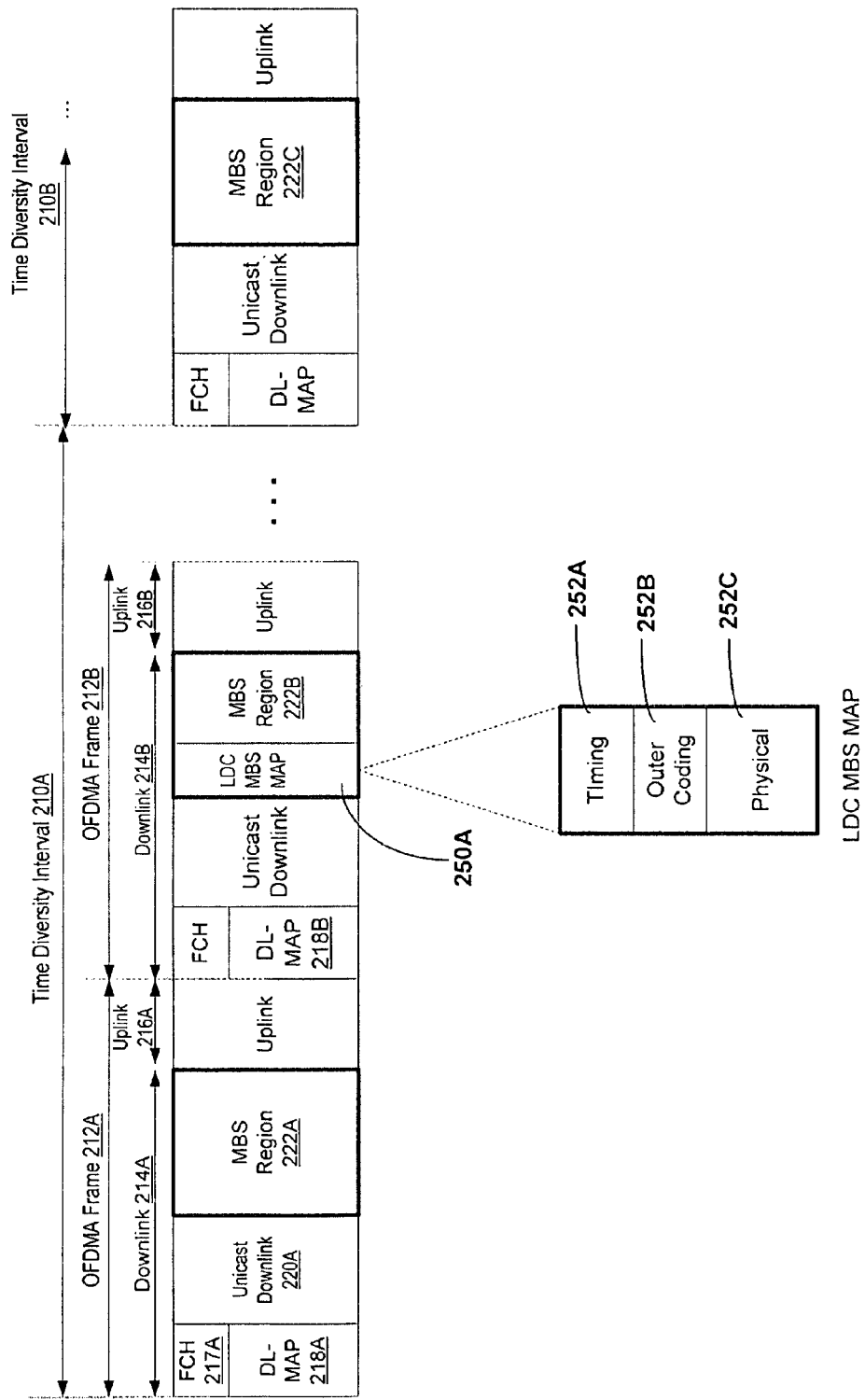
FIG. 2A depicts a time diversity interval including a macrodiversity-multicast and broadcast (MBS) region, which further includes a low duty cycle MBS MAP (LDC MBS MAP) message.

FIG. 2A depicts a time interval, such as a time diversity intervals 210A, 210B, and the like, consistent with some embodiments of the invention. As used herein, the term time diversity interval (TDI) will be used to refer to a time interval during which a group of consecutive OFDMA frames are transmitted. As illustrated, a time diversity interval 210A includes one or more OFDMA frames, such as OFDMA frames 212A-B, etc. Each of the OFDMA frames 212A-B represents a region over which one or more OFDMA symbols are transmitted. An OFDMA frame may include a portion of the frame for downlink transmissions, as depicted at downlinks 214A-B, and a portion for uplink transmissions, as depicted at uplinks 216A-B. A downlink, such as downlink 214A, may include a frame control header (FCH) 217A, downlink (DL) MAP (DL-MAP) 218A, a unicast downlink 220A, and an MBS region, such as MBS region 222A. The MBS regions 222A-C can be transmitted by a plurality of base stations using macrodiversity (MD). Other portions of the frames, such as the frame control headers, downlink MAPs, unicast downlinks, and uplinks can be transmitted in a non-macrodiversity manner. IEEE 802.16 is an example of a standard that supports the transmission of OFDMA frames 212A-B as well as macrodiversity transmissions of the MBS regions.

The MBS regions may carry content from a service. A service may provide a stream of packets corresponding to content, such as a video stream of packets consistent with, for example, H.264 (i.e., International Telecommunications Union, H.264: Advanced video coding for generic audiovisual services video stream of packets, November 2007). It should be noted that video is but one example of data that may be carried in the MBS region, and the MBS region may be used to carry other types of data, such as, for example, radio streams, audio streams, geographical MAP data, local traffic information, or any other type of data. For explanatory purposes, the below embodiments will be described with reference to the MBS region being used for providing a television service, where each stream corresponds to a particular television channel (e.g., one stream for carrying CNN, one stream for carrying ESPN, etc.)

The streams for the service may be inserted into the data regions, such as MBS regions, for transmission by one or more base stations to one or more client stations. Moreover, the transmission of the MBS regions may use macrodiversity, as noted above. Furthermore, the transmission may be in a zone, such as a geographic area. To illustrate using a broadcast television analogy, the zone may be the area of San Diego, and the streams may each correspond to a channel of content available in San Diego. As such, a user at a client station may change streams (e.g., channels) to change service content at the client station.

A stream may include one or more substreams. For example, a stream of H.264 video may be divided into two substreams, so that one substream includes important content requiring more error correction and/or more robust modulation than the other substream. For example, in the example of H.264 being used to carry a television channel stream (e.g., CNN), a first substream may be used for carrying very important data (referred to as part A data), such as slice headers, macro block headers, motion vectors, etc., a second substream for carrying less important information, such as intra residual data (referred to as part B), and a third substream for carrying even less important information, such as inter residual data (referred to as part C). Or, for example, two substreams may be used with the first substream carrying part A and part B data, and the second substream carrying part C data, or the data may be combined in some other way. It should be noted that this is but one example provided for exemplary purposes only.

FIG. 2A also depicts MBS region 222B, which includes a MBS MAP 250A, which further includes timing information 252A, outer coding information 252B, and physical information 252C, all of which describe the content of the MBS regions. For explanatory purposes, the MBS MAP of the present embodiments will be referred to as a low duty cycle (LDC) MBS MAP. The MBS regions may be transmitted by a plurality of base stations using macrodiversity (MD). When transmitted using macrodiversity, the LDC MBS MAP benefits from improved SINR (signal to interference-plus-noise ratio), when compared to the non-macrodiversity transmissions of the frame check header (FCH) 217A, downlink MAP (DL-MAP) 218A, unicast downlink 220A. Although the description herein uses examples that refer to the MBS regions, the subject matter described herein can be used with other data regions of a frame and can be used in implementations not using macrodiversity.

Figure 2B:
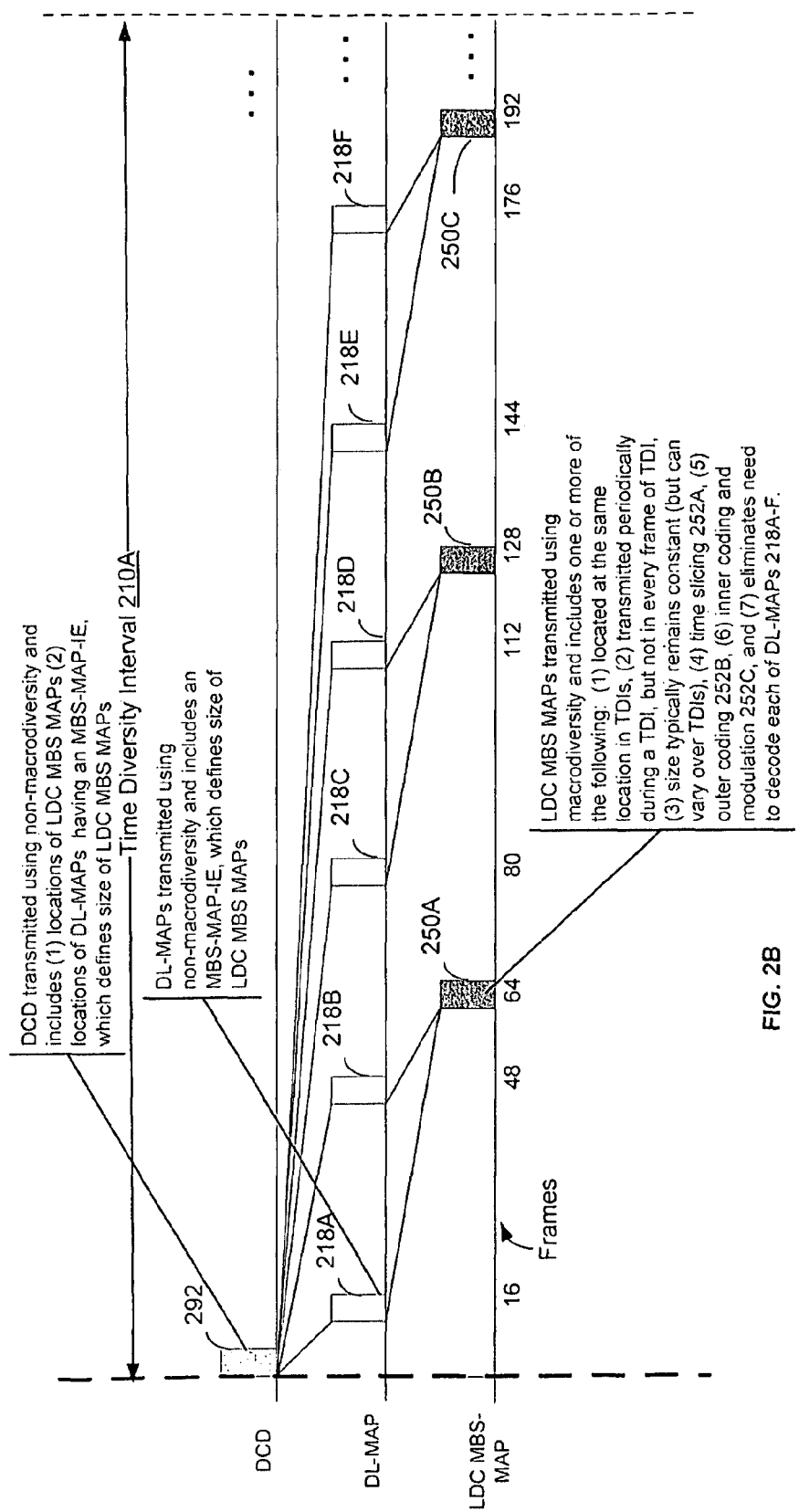
FIG. 2B depicts a timeline of messages including a downlink channel descriptor (DCD), a downlink MAP (DL MAP), and an LDC MBS MAP.

FIG. 2B depicts the time diversity interval (TDI) 210A of FIG. 2A further including a downlink channel descriptor (DCD) 292 as well as downlink MAP messages 218A-F, and LDC MBS MAP messages 250A-C. Although FIG. 2B depicts downlink channel descriptor message 292 as being in the first frame of time diversity interval 210A, downlink channel descriptor message 292 may be located in other locations as well. Moreover, time diversity interval 210A as well as subsequent time diversity intervals have a periodic structure, such that once a downlink channel descriptor message 292 indicates the starting point (e.g., location of the first frame of the TDI) and the size of the TDI, the location and size repeats in one or more subsequent TDIs.

Referring to FIG. 2B, the downlink channel descriptor message 292 specifies the location of the first frame of the time diversity interval, such as time diversity interval 210A. The downlink channel descriptor message 292 also includes information identifying the possible locations of the downlink MAPs 218A-F (which may have MBS MAP IE for a particular MBS zone) and the locations of the LDC MBS MAP messages 250A-C. For example, downlink channel descriptor message 292 may indicate that downlink MAP messages 218A-F are located at the following OFDMA frames within time diversity interval 210A: 16, 48, 80, 112, 144, and 176. Downlink channel descriptor message 292 may also indicate, for example, that LDC MBS MAP messages 250A-C are located at the following OFDMA frames within the time diversity interval 210: 64, 128, and 192. The downlink channel descriptor message 292 may also specify the modulation and coding used for the LDC MBS MAPs. This information specifying the location of the LDC MBS MAPs may include information identifying the OFDMA frame that includes the first LDC MBS MAP in the time diversity interval, how often the LDC MBS MAP is repeated and the period of repetition in the time diversity interval, and at which symbol in the OFDMA frame the LDC MBS MAP starts for frames in which the LDC MBS MAP is included. Moreover, the locations of LDC MBS MAPs from time diversity interval to time diversity interval typically remain fixed, and the modulation and coding used to transmit the LDC MBS MAP typically remains fixed as well. The downlink channel descriptor message 292, however, in the present embodiment does not describe the size of the LDC MBS MAP, which can vary from time diversity interval to time diversity interval.

The downlink channel descriptor message 292 does, however, identify which downlink MAP (DL-MAP) messages 218A-F include information specifying the size (e.g., in OFDMA symbols) of the LDC MBS MAP(s) in a particular time diversity interval. The DL-MAP may specify the size of the LDC MBS MAP(s) included in the time diversity interval in which the DL-MAP appears, or the size of LDC MBS MAP(s) included in a future time diversity interval (e.g., the LDC MBS MAP(s) included in the next time diversity interval). For exemplary purposes, in the present embodiment, the size of the LDC MBS MAP specified in a particular DL-MAP message will specify the size of the LDC MBS MAPs appearing in the time diversity interval in which the DL-MAP message is included.

The size of the LDC MBS MAP may be described in terms of OFDMA symbols. Although the size of the LDC MBS MAPs may vary from time diversity interval to time diversity interval, in implementation it is likely that LDC MBS MAPs size will remain fixed from time diversity interval to time diversity interval unless, for example, services, such as streams and substreams, are added or deleted from the content multiplexed for transmission via the MBS regions. This LDC MBS MAPs size information may be included in the DL-MAP message in a variety of manners. For example, in the present embodiment the size information will be described as included in an MBS MAP IE, which is included in a DL-MAP message. Further, in an embodiment, this MBS MAP IE may be included in the first OFDMA frame of a time diversity interval, as well as the OFDMA frames in which an LDC MBS MAP appears. These locations, however, are exemplary only and in other embodiments different locations may be used for including this LDC MBS MAP size information.

The following example illustrates network entry using the management messages depicted at FIG. 2B. When a client station enters a network (e.g., from a so-called "cold start"), the client station initially receives and decodes the downlink channel descriptor message 292. The downlink channel descriptor message 292 signals the start of a time diversity interval and advertises the location (e.g., an offset in OFDMA frames from the start of the time diversity interval) of the downlink MAPs 218A-B. The client station may then attempt to decode the downlink MAP 218A, which specifies the size of the LDC MBS MAPs in a particular time diversity interval. As noted above, the same information may be included in one or more information elements (e.g., an MBS MAP IE message).

Given a successful decoding of the downlink channel descriptor message 292 and downlink MAPs 218A-B, the client station then receives and decodes the LDC MBS MAP message 250A. As noted above, in the present embodiment, the LDC MBS MAP message 250A includes information sufficient to permit the client station to decode the MBS regions included in a particular time diversity interval. For example, the LDC MBS MAP may describe the MBS regions that are included in a future time diversity interval. The term "relevance" is used herein to identify the future time diversity interval that the LDC MBS MAP is related to. For example, if the LDC MBS MAP has a relevance of one, then it describes the MBS regions in the time diversity interval immediately following the time diversity interval in which the LDC MBS MAP is included. If the LDC MBS MAP has a relevance of two, then the LDC MBS MAP describes the MBS regions included in the second time diversity interval following the time diversity interval in which the LDC MBS MAP is included, and so on. For explanatory purpose, unless otherwise noted, in the below descriptions it will be assumed that the LDC MBS MAPs have a relevance of one, meaning that the LDC MBS MAPs describe the MBS regions in the time diversity interval immediately following the time diversity interval in which the LDC MBS MAP is included.

The LDC MBS MAP also may include an identifier that indicates the size of the LDC MBS MAP included in a subsequent time diversity interval (e.g., in an immediately following time diversity interval given a relevance of one). Thus, the client station will know the size of the LDC MBS MAP included in the next time diversity interval without having to decode one or more of the subsequent downlink MAP messages. Accordingly, once a particular stream is obtained, the client station may continue to receive and decode LDC MBS MAPs, the described MBS regions, and the desired stream of packets without the need to decode downlink MAP messages or DCD messages.

For example, the LDC MBS MAP 250 may include information to locate and decode the next LDC MBS MAP and include information, such as timing information 252A, outer coding information 252B, physical information 252C, size of the MBS region, and the like, as described further below. However, if the client station loses synchronization (e.g., the receiver is severely lost with respect to timing), the client station may recover by once again decoding the downlink channel descriptor messages and, in some cases, the downlink MAP messages, although in some recovery cases a receiver may not require receiving the downlink channel descriptor message (e.g., after a reboot, the receiver may associate the OFDMA frame number before and after the reboot and find the boundary of the time diversity interval after the reboot without receiving the downlink channel descriptor message).

Moreover, when the size of the LDC MBS MAP message does change, the change is signaled by the LDC MBS MAP message itself, as well as by the downlink MAP messages. For example, LDC MBS MAP message 250A may include information indicating that the next LDC MBS MAP is increasing in size from 10 OFDMA symbols to 12 OFDMA symbols. In this example having a relevance of one, as long as the client station successfully decodes the LDC MBS MAP 250A, the client station does not need to decode the downlink channel descriptor and each of the downlink MAPs in order to decode a subsequent LDC MBS MAP and the corresponding MBS regions.

Because the LDC MBS MAPs 250A-C are included in the MBS regions, they may be transmitted using macrodiversity as part of the MBS regions. Thus, because macro-diversity gain may be realized when receiving and decoding the MBS regions, the LDC MBS MAPs may be received with a higher SINR than non-macrodiversity signals which may be unique for each base station, such as the DL-MAP and DCD. Moreover, LDC MBS MAPs 250A-C provide a client station with sufficient information (e.g., timing information 252A, outer coding information 252B, physical information 252C, and the like) to decode the MBS regions.

Moreover, as noted above, the LDC MBS MAP typically has a fixed location in a time diversity interval (e.g., located at the same offset, in terms of OFDMA symbols, from the start of the time diversity interval). The LDC MBS MAP is also typically transmitted one or more times during a time diversity interval, but not in every OFDMA frame of the time diversity interval, nor in every MBS region included in a time diversity interval. As such, the LDC MBS MAP is considered "low duty cycle" as it is typically sent less frequently than the MBS MAP defined by the IEEE 802.16 standard. Furthermore, the LDC MBS MAPs in a given TDI are equivalent and have the same size.

Although only a single, successful reception of an LDC MBS MAP is required by a client station during a given time diversity interval (as a single LDC MBS MAP includes sufficient information to decode all of the MBS regions in a time diversity interval and/or in a subsequent time diversity interval), the LDC MBS MAP may be sent multiple times in a given time diversity interval to improve the likelihood that the relevant portions of the LDC MBS MAP will be successfully received by the client station. For example, in some implementations, the LDC MBS MAP 250A is transmitted two additional times (e.g., LDC MBS MAPs 250B-C) in time diversity interval 210A to increase the probability of reception of the LDC MBS MAP at the edge of MBS coverage. This added LDC MBS MAP message makes it more likely that the receiving client station has multiple chances to decode at least one of the LDC MBS MAPs. Moreover, in some embodiments, each LDC MBS MAP includes information sufficient to decode the MBS regions.

Moreover, a receiver may be interested in different parts of the LDC MBS MAP and, as such, does not need to decode the entire LDC MBS MAP. Furthermore, the receiver may receive one part of interest from the LDC MBS MAP in one attempt and the other parts during other attempts. For example, for a given zone, the LDC MBS MAP may include (1) a numbering system consecutively numbering the OFDMA symbols across the MBS regions of a time diversity interval and defining the widths of the MBS regions, (2) a stream locator listing streams and substreams and their locations within the time diversity interval, and (3) the size of another, subsequent LDC MBS MAP (e.g., the size of the LDC MBS MAP in the immediately following time diversity interval given a relevance of one).

For each stream of a given zone, the LDC MBS MAP may also include substream information, which is included in one or more of the timing information 252A, outer coding information 252B, and physical information 252C. Timing information 252A may describe when a substream is transmitted as a burst of symbols within a time diversity interval. Moreover, timing information enables a client station to determine when to receive different pieces (or segments) of the substream. Outer coding information 252B may describe the outer coding, such as Reed-Solomon forward-error correction, applied to the packets in the substream before the packets are transmitted from the base station to the client station. Physical information 252C may describe the physical layer associated with the MBS regions (e.g., the modulation and coding used to transmit the OFDMA symbols of the MBS regions).

Figure 3:
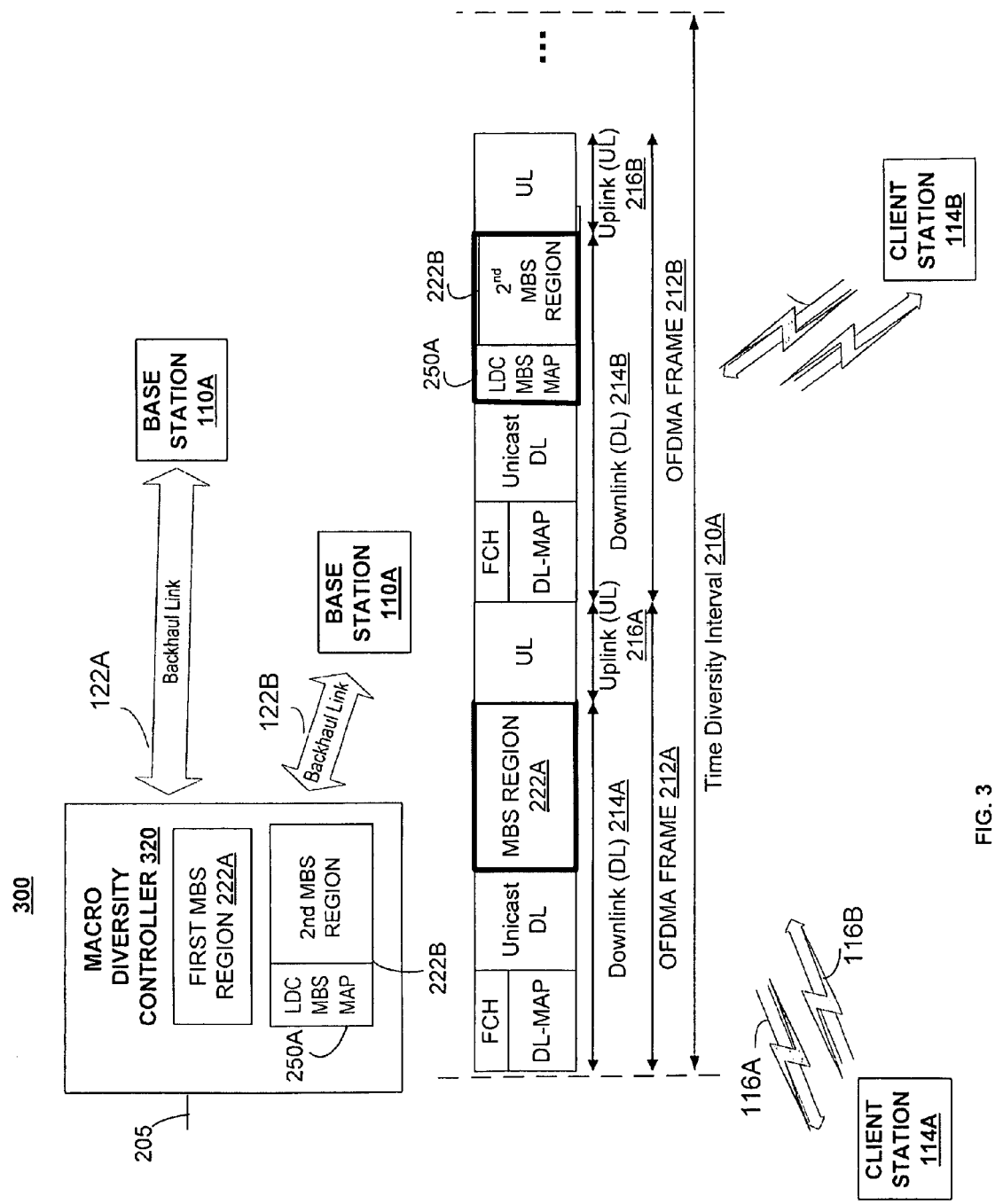
FIG. 3 depicts a block diagram of a system including a multicast broadcast controller.

FIG. 3 depicts a block diagram of a system 300 including a macrodiversity controller 320, base stations 110A-B, and client stations 114A-B. The macrodiversity controller 320 provides a first MBS region 222A and schedules the transmission of the first MBS region 222A at base stations 110A and 110B to achieve macrodiversity for transmission of the first MBS region 222A. The macrodiversity controller 320 also provides a second MBS region 222B (which includes LDC MBS MAP 250A) and schedules the transmission of the second MBS region 222B at base stations 110A-B to achieve macrodiversity for transmission of the second MBS region 222B.

The macrodiversity controller 320 distributes each MBS region 222A-B to zero or more base stations, such as base stations 110A and 110B. The macrodiversity controller 320 also schedules the transmissions of MBS regions 222A-B at base stations 110A-B, such that the transmissions are synchronous with respect to the same OFDMA frames being transmitted at about the same frequency, using about the same waveform (e.g., modulation and coding scheme), and using about the same framing parameters (e.g., number of symbols in the OFDMA frame, length of OFDMA symbols, cyclic prefix, and location of the MBS region within the frame, and the like at a given time). The base stations 110A-B each insert the MBS regions 222A-B into corresponding OFDMA frames 212A -B, and then synchronously transmit the OFDMA frames 212A-B to client stations, such as client stations 114A-B. Although the MBS regions 222A-B are transmitted using macrodiversity, other portions (e.g., the unicast DL portion and the UL portion) of the OFDMA frames may not use macrodiversity.

At the client stations, such as client stations 114A-B, macrodiversity provides a so-called "macrodiversity gain" by permitting the client stations to combine the synchronous broadcasts of the MBS regions transmitted by the base stations 110A-B—providing at the client stations a macrodiversity gain with respect to the transmitted MBS regions.

Base stations 110A-B transmit MBS regions 222A-B as depicted by the OFDMA frames 212A-B of time diversity interval 210A to each of client stations 114A-B. Once a client station locates the LDC MBS MAP 250A by decoding a downlink channel descriptor (DCD) message and the downlink MAP (DL-MAP) messages as described above, the client station can continue to locate subsequent LDC MBS MAPs without having to decode one or more subsequent downlink channel descriptor messages and each of the downlink MAP messages in the OFDMA frames containing the MBS regions to be received. Moreover, since the LDC MBS MAPs appear at about the same locations and typically have the about same size for a given time diversity interval, a client station can attempt to recover synchronization when lost by attempting to acquire the LDC MBS MAP at its expected location. If that recovery attempt fails, the client station may then recover by re-acquiring the downlink MAPs and, in some instances, the downlink channel descriptor message.

Figure 4:
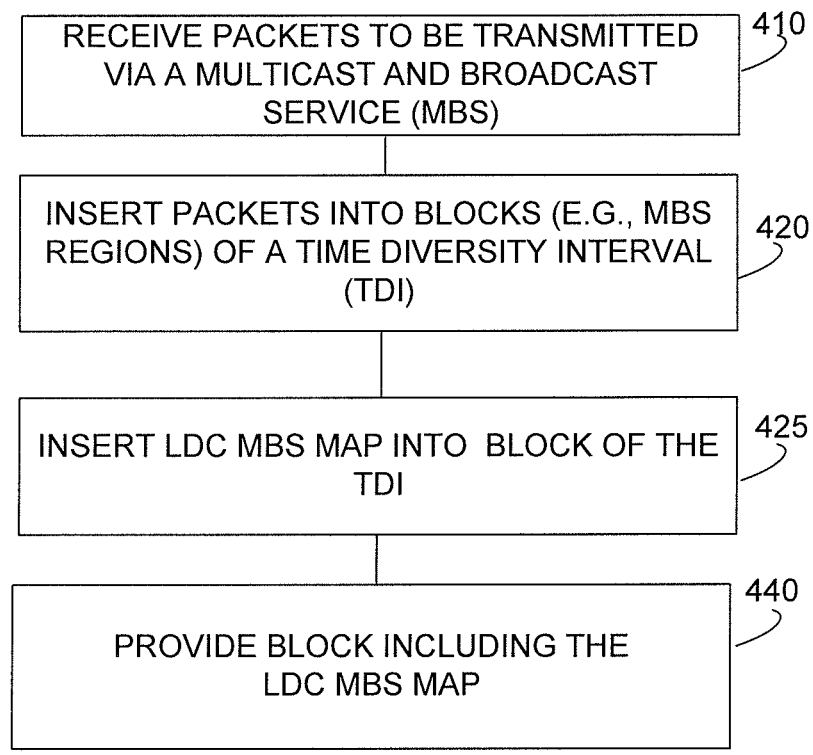
FIG. 4 depicts a process for using an LDC MBS MAP message.

FIG. 4 describes a process 400 for inserting the LDC MBS MAPs into one or more MBS regions. The description of process 400 will refer to FIGS. 2A, 2B, 3, and 4.

At 410, the macrodiversity controller 320 receives packets 205 to be transmitted via data regions, such as a macrodiversity-multicast and broadcast (MBS) regions 222A-B. For example, the packets may be received as a stream (including substreams) of content from a service, such as a digital video broadcast, multimedia content from the Internet, and the like.

At 420, the macrodiversity controller 320 inserts the packets into one or more data regions (also referred to as blocks). For example, macrodiversity controller 320 may insert a stream of packets into MBS region 222A, filling MBS region 222A with packets, and then continuing to fill MBS region 222B with additional packets, and so forth filling additional MBS regions.

At 425, macrodiversity controller 320 inserts an LDC MBS MAP into at least one of the MBS regions of the time diversity interval. Furthermore, the location of the LDC MBS MAP may be fixed. For example, the LDC MBS MAP may be inserted at a fixed offset from the start of the time diversity interval, such as at a given OFDMA symbol of a given OFDMA frame of the time diversity interval. As such, the LDC MBS MAP would appear at the same fixed offset from the start of subsequent time diversity intervals. In addition, the LDC MBS MAP may include one or more of the following: timing information 252A, outer coding information 252B, physical information 252C, size of a subsequent LDC MBS MAPs, and the like.

Timing information 252A identifies the time of transmission of different pieces of each substream. The "stream" carries a service providing content, and includes a packet stream and substreams of related multi-media content. As noted above, a stream may include one or more substreams, and each of the substreams may be assigned to one or more segments. A segment is a set of consecutive OFDMA symbols numbered using, for example, a consecutive numbering system across all of the OFDMA symbols associated with the MBS regions of a time diversity interval. The consecutively numbered OFDMA symbols comprising a segment are not necessarily continuous OFDMA symbols as the OFDMA symbols may be in different MBS regions in different OFDMA frames.

The outer coding information 252B describes the format used for interleaving and/or outer coding of the content of the MBS regions. For example, a substream of packets may be processed by an interleaver and forward-error correction coder before being carried by the OFDMA symbols of the MBS region transmitted by the base station to the client station. As such, the description of the interleaving and forward-error correction coding method used at the base station is included in the outer coding information 252B, which is included in the LDC MBS MAP. Further, each substream may use a different FEC type.

The physical information 252C describes the modulation and coding selection (MCS) used to physically transmit the OFDMA symbols carrying the MBS regions. For example, physical information 252C may describe that a segment (e.g., carrying a stream and substream) includes OFDMA symbols modulated using QPSK and having a ½ rate code, while another segment includes OFDMA symbols modulated using 64-ary QAM and rate ½ coding.

As noted above, the LDC MBS MAP may also describe a numbering system, which assigns a consecutive sequence of numbers to groups of OFDMA symbols across different OFDMA frames in a time diversity interval, although some embodiments may not include the numbering system. The numbering system may also include a pattern vector describing the size(s) of the groups of OFDMA symbols. For example, the OFDMA symbols in a time diversity interval may be labeled with a numbering system from 1 to 200, while the pattern vector defines patterns, such as how those numbers are allocated to each MBS region (and thus defining the width of each of the MBS regions as a function of OFDMA symbols). In some embodiments, the numbering system is repeated from time diversity interval to time diversity interval allowing a compact mechanism for assigning numbers to the OFDMA symbols of MBS regions and assigning the numbers to streams, substreams, and segments. While in other embodiments, the numbering system is not repeated in a different TDI (e.g., a new numbering system may be used in each and every TDI).

At 440, macrodiversity controller 320 provides at least one MBS region that includes an LDC MBS MAP. For example, macrodiversity controller 320 may provide first MBS region 222A to base stations 110A-B for a macrodiversity transmission to client stations 114A-B, and then provide second MBS region 222B (including LDC MBS MAP 250A) to base stations 110A-B for a macrodiversity transmission to client stations 114A-B.

Figure 5:
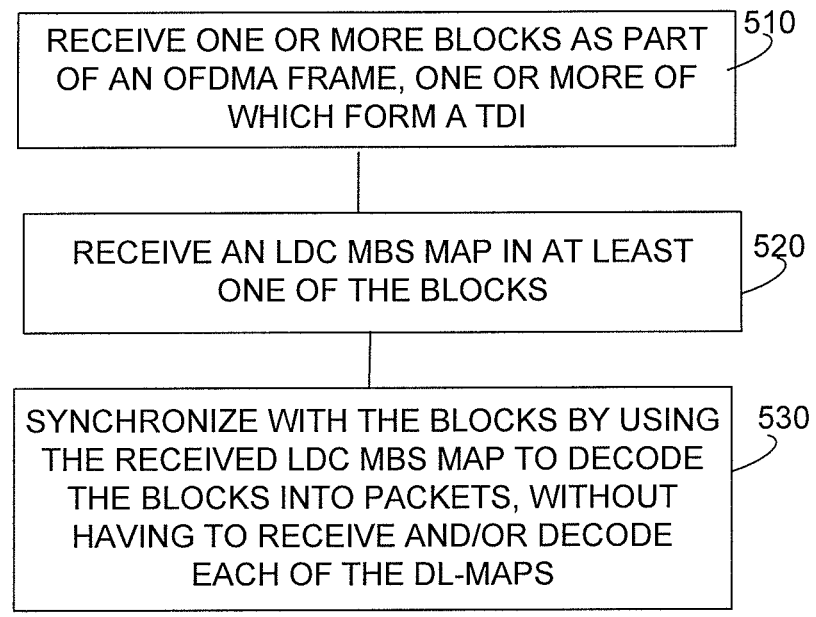
FIG. 5 depicts a process for using, at a client station, an LDC MBS MAP message.

FIG. 5 depicts a process 500 used by, for example, a client station to receive LDC MBS MAPs. The description of process 500 will refer to FIGS. 2A, 2B, 3, and 5.

At 510, a client station receives one or more regions, such as MBS regions 222A-B, as part of OFDMA frames forming a time diversity interval. For example, client station 114A may receive OFDMA frames 212A-B, after receiving a downlink channel descriptor message, such as downlink channel descriptor message 292, which signals the start of time diversity interval 210A and provides the location downlink MAPs (which include the MBS MAP IE) and the location of the LDC-MBS MAP 250A. Client station 114A also receives the downlink MAPs, which includes the size of the LDC MBS MAPs.

At 520, the client station receives an LDC MBS MAP in at least one of the received MBS regions. For example, MBS region 222A may not include an LDC MBS MAP, while MBS region 222B may include LDC MBS MAP 250A. The LDC MBS MAP 250A includes sufficient information (e.g., one or more of timing information 252A, outer coding information 252B, physical information 252C, size of another, subsequent LDC MBS MAP, and the like) to enable the client station to decode the contents of the MBS regions of the time diversity interval and locate subsequent LDC MBS MAPs, without using the downlink MAP and downlink channel descriptor unless, for example, the size of the LDC MBS MAP changes (which would require resynchronization using the downlink MAP messages and/or the downlink channel descriptor message). For example, given a relevance of one, once LDC MBS MAP 250A is decoded from MBS region 222B and time diversity interval 210A, the LDC MBS MAP and MBS regions in the immediately following time diversity interval may be received and decoded without decoding the downlink MAP and downlink channel descriptor messages. Although the previous example uses a relevance of one, other relevance values (e.g., 2, 3, etc.) may be used as well.

At 530, the client station synchronizes with the blocks (e.g., MBS regions) by using the received LDC MBS MAP 250A to decode the MBS regions, without using the downlink MAP and downlink channel descriptor. For example, the decoding of LDC MBS MAP 250A enables the client station to physically decode (e.g., using physical information 252C) the content of the MBS regions, perform outer decoding (e.g., using outer code information 252B) applied at the base station, and also precisely locate symbols of a stream, substream, and/or segment of interest (e.g., using timing information 252A).

Figure 6:
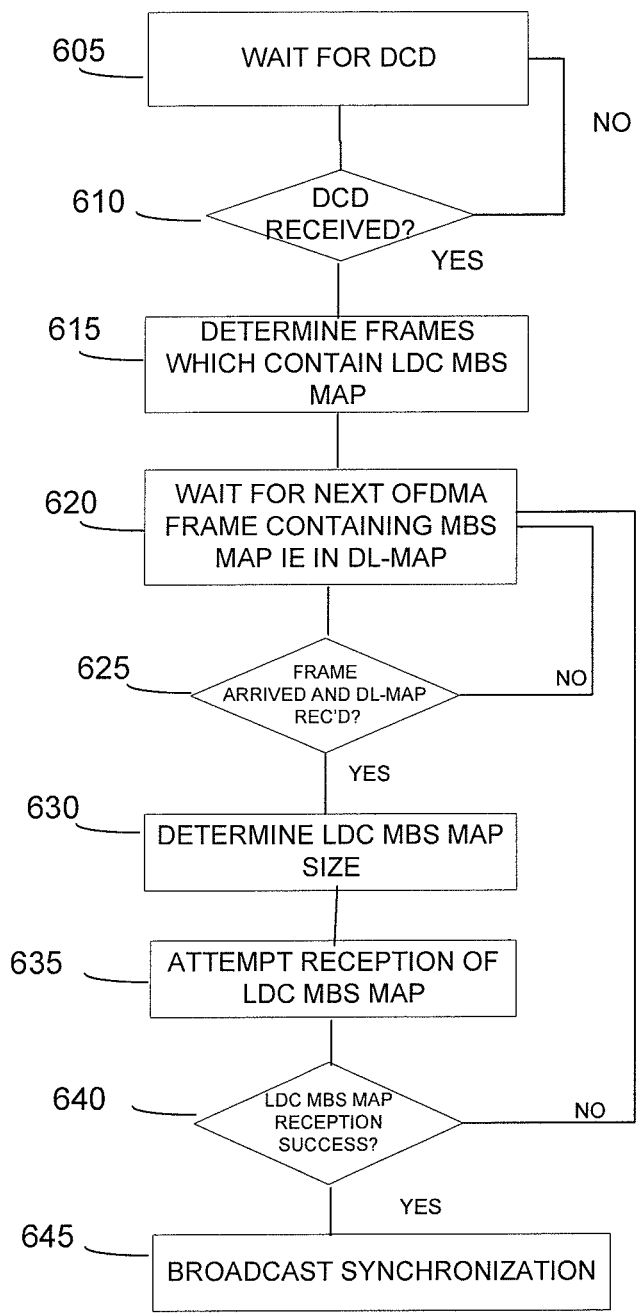
FIG. 6 depicts another process for using, at a client station, an LDC MBS MAP message.

FIG. 6 depicts another process 600 used by, for example, a client station to receive LDC MBS MAPs. The description of process 600 will refer to FIGS. 2A, 2B, 3, and 6.

At 605, a client station, such as client station 114A, waits for a downlink channel descriptor message. When a downlink channel descriptor message, such as downlink channel descriptor 292, is not received at client station 114A (no at 610), the client station 114A continues to wait for the downlink channel descriptor message.

When a downlink channel descriptor message is received at client station 114A (yes at 610), the client station 114A uses the downlink channel descriptor message to determine, at 615, which OFDMA frames include LDC MBS MAPs as well as which OFDMA frames include downlink MAP (DL-MAP) messages. That is, the client station 114A may retrieve information from the downlink channel descriptor that defines the location(s) of the LDC MBS MAP(s) in the time diversity intervals. Further, as noted above, the downlink channel descriptor may further define the location(s) of the start of the time diversity interval(s). As noted above, in an embodiment, the MBS MAP IE (which may appear in the downlink MAP) may be included in the downlink MAP of the first OFDMA frame of a time diversity interval as well as in the OFDMA frames in which an LDC MBS MAP is included. As such, by the downlink channel descriptor defining the location of the start of the time diversity interval(s) as well as the locations of the LDC MBS MAPs, the client station 114A may determine the locations of the downlink MAP messages that carry an MBS MAP IE. The DCD message also specifies a set of OFDMA frames within the TDI where the DL MAP may contain the MBS MAP IE.

At 620, client station 114A waits for the OFDMA frame including the MBS MAP IE in the downlink MAP (DL-MAP), although in some instances a receiver may attempt to decode LDC MBS MAP without receiving the DL MAP. If the OFDMA frame including the MBS MAP IE for the MBS zone in the downlink MAP is not received at client station 114A, client station 114A continues to wait (no at 625). As noted above, client station 114A may determine the location(s) of the downlink MAPs with MBS MAP IE from information carried in the downlink channel descriptor received in step 605. When the OFDMA frame including the MBS MAP IE in the downlink MAP arrives and is thus received at client station 114A (yes at 625), client station 114A reads the downlink MAP in that OFDMA frame, recovers the MBS MAP IE, and then determines, at 630, the LDC MBS MAP size from the MBS MAP IE in the downlink MAP.

Given a start of a time diversity interval, a location of an OFDMA frame including the LDC MBS MAP, and a location (and a size) of the LDC MBS MAP, client station 114A may, at 635, attempt to receive the LDC MBS MAP, as its location can be determined. If the LDC MBS MAP is successfully received, client station 114A can decode the LDC MBS MAP and synchronization is achieved at 645. Client station 114A may then also determine, based on the decoded LDC MBS MAP, how to decode the MBS regions. Further, as noted above, in the presently described embodiments, the LDC MBS MAP is assumed to have a relevance of one (1), meaning that the LDC MBS MAP does not describe the MBS regions in the current time diversity interval, but instead describes the MBS regions included in the time diversity interval immediately following the current time diversity interval, although other values may be used for the relevance. Moreover, as noted above, client station 114A may locate subsequent LDC MBS MAPs and decode subsequent MBS regions using only information transmitted in the MBS region (e.g., using simply the LDC MBS MAP and the previously obtained information rather than retrieving and decoding additional downlink MAPs and downlink channel descriptors, which may be non-macrodiversity messages).

Although the above embodiment was discussed with reference to an MBS MAP IE in the DL-MAP including information regarding the LDC MBS MAP size, it should be noted that in other embodiments, the DL-MAP need not be used, or, for example, the DL-MAP may not include information specifying the LDC MBS MAP size. Rather in such implementations, techniques may be used for obtaining the LDC MBS MAP where the LDC MBS MAP size need not be known prior to obtaining the MAP. Additionally, although the above-described embodiments describe the DCD message including information for locating the LDC MBS Maps, in other embodiments, this information need not be included in the DCD. For example, in an embodiment, the locations of the TDIs may be specified in the DCD, but the location of the LDC MBS MAPs within a TDI may be stored in a management information base (MIB) located in the client stations, base stations, etc. Or, for example, this information for locating the LDC MBS MAPs may be obtained by other mechanism that need not use the DCD.

The subject matter described herein also relates to a base station implementing a so-called "convergence sublayer." The convergence sublayer refers to performing, at a base station, macrodiversity controller, and/or other control element, one or more of the following: classifying packets based on the stream and substream that the packets belong to and then processing the packets based on that classification. In some embodiments, the classification may include determining pattern information and/or packet boundary information, both of which are described further below. Moreover, in some embodiments, a message generator uses this determined information to generate a convergence sublayer information element (IE) message, which is the message described below with respect to FIGS. 7A-7F. The generated convergence sublayer IE message is sent to a client station to configure the client station for accessing packets sent from a base station. In other words, after a client station achieves the above-described synchronization, the convergence sublayer IE message defines pattern information, packet boundary information, and the like, so that the stream (including substreams) can be accessed (e.g., read, reconstructed, and the like) at a client station.

In some embodiments, a stream is a flow of information (e.g., packets, such as application data packets), which in its entirety carries information for a media stream, such as a video stream, an audio stream, or a combination of video, audio, and hypertext. The stream may also be identified with a stream identifier (ID), and each stream may include at least one substream and at most fifteen substreams, although other quantities of substreams may be associated with a stream as well. Each substream carries packets that are substantially similar with respect to outer coding and physical information (e.g., the modulation and coding scheme).

In some embodiments, the convergence sublayer IE message includes one or more of the following outer coding mode information (described further below); a length of the convergence sublayer IE message (e.g., how long in bytes or packets is the message); an indication of whether an Embedded MBS MAP (described further below) is being used; a quantity (or number) indicating the number of substreams specified by the convergence sublayer IE message. In some embodiments, the convergence sublayer IE message includes pattern information representative of a pattern used to write a stream of packets (e.g., application data packets 705) into a data structure (e.g., table 740A). The convergence sublayer IE message may also include packet boundary information representative of start locations of packets in the table. The convergence sublayer IE message may also identify whether application layer packets are appended with a CRC. The generated convergence sublayer IE message, in some embodiments, is inserted as the first one or more packets of the first substream of each stream.

Figure 7A:
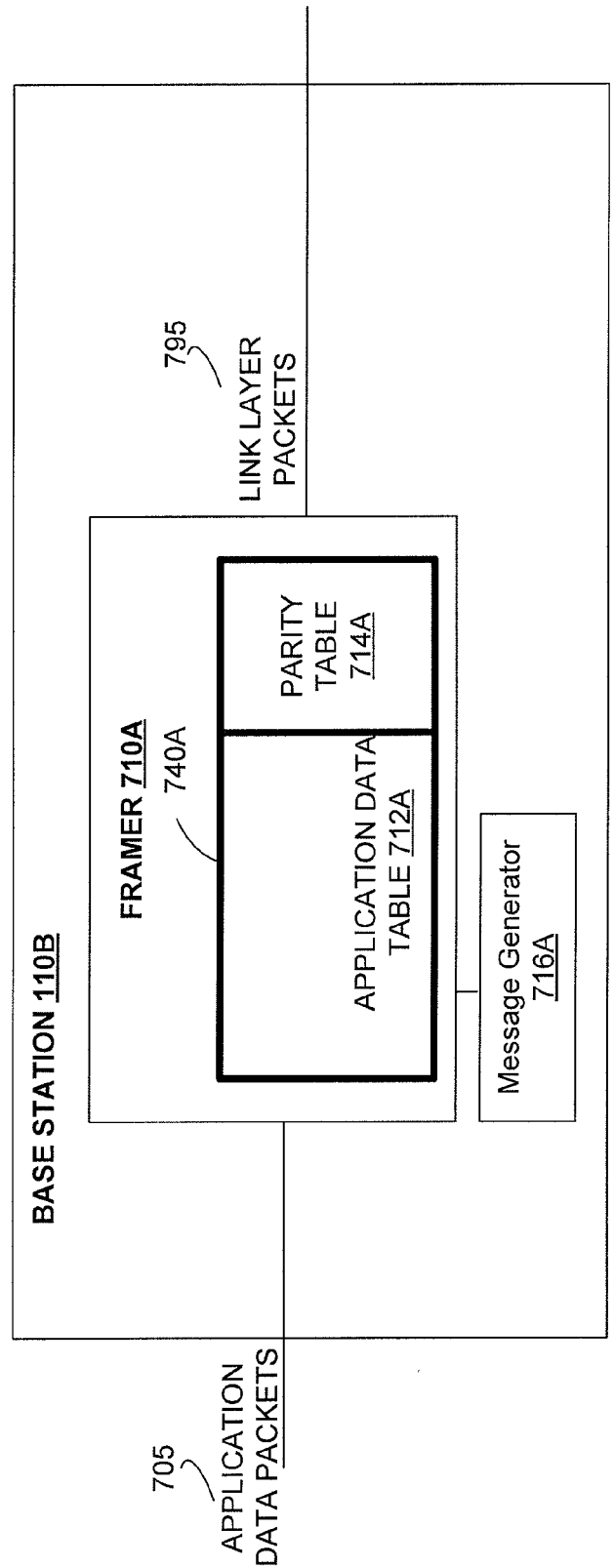
FIG. 7A depicts a base station configured to generate a message including pattern information and packet boundary information.

FIG. 7A depicts an implementation of base station 110B. Although the components of FIG. 7A are depicted at a base station, this is only exemplary since the components depicted at FIG. 7A may be embodied in other locations (and in a plurality of locations as well). For example, in some embodiments, the components, such as framer 710A and message generator 716A, are implemented in a multicast broadcast service (MBS) controller, which builds link-layer packets and sends those link-layer packets to base station(s) via an ASN-GW (access service network-gateway). Base station 110B includes a framer 710A for arranging data (e.g., received application data packets 705 configured as a stream including substreams as noted above) into a table, such as a Reed-Solomon table 740A, to enable interleaving and forward-error correction coding of the packets 705. Base station 110B further includes a message generator 716A configured to generate a message, such as the convergence sublayer IE message. In some embodiments, the generated message includes pattern information representative of a pattern used to write a stream of packets (e.g., application data packets 705) into a data structure (e.g., table 740A). The generated message may also include packet boundary information representative of start locations of packets in the data structure. Moreover, the message generator 716A may, in some embodiments, insert the generated message (which comprises one or more packets) into the Reed-Solomon table, such that the generated message is the first one or more packets of a first substream of a stream.

The Reed-Solomon table 740A further includes an application data table 712A and a parity table 714A. For example, framer 710A inserts received application data packets 705 into the Reed-Solomon table 740A (and, in particular, application data table 712A) to enable Reed-Solomon encoding of the packets in that table.

Figure 7B:
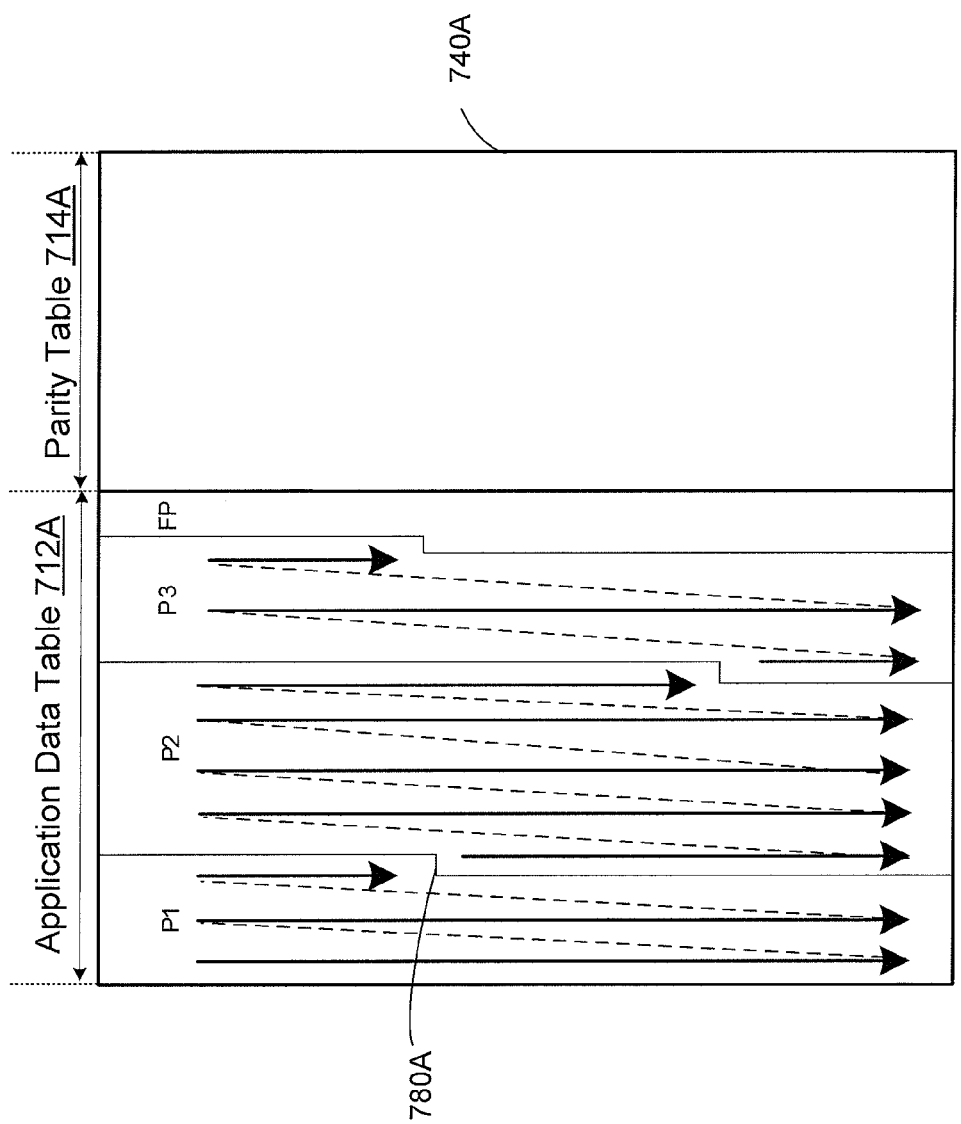
FIG. 7B depicts a column-by-column pattern for arranging packets in a Reed-Solomon table.

FIG. 7B depicts application data packets 705 inserted as packets P1, P2, and P3. Although FIG. 7B depicts a fill packet (labeled FP) spanning more than one column, this is only an example since the fill packet need only fill the application data table portion 712A. Specifically, the bytes of a received packet (e.g., packet labeled "P1") is inserted into application data table 712A column-by-column (e.g., bytes of the received packet are inserted into the first column, then the second column, and then partially filling column 3). The partially filled columns represent that the packets in column 780A are so-called "fragments" since the packet P1 does not completely fill that column. FIG. 7B also depicts subsequent packets (e.g., packets P2 and P3) inserted into subsequent columns of application data table 712A. Packet P2 is also a fragment at column 780A since it does not completely fill column 780A. Furthermore, FIG. 7B depicts a fill packet (labeled "FP") used to fill application data table 712A.

Figure 7C:
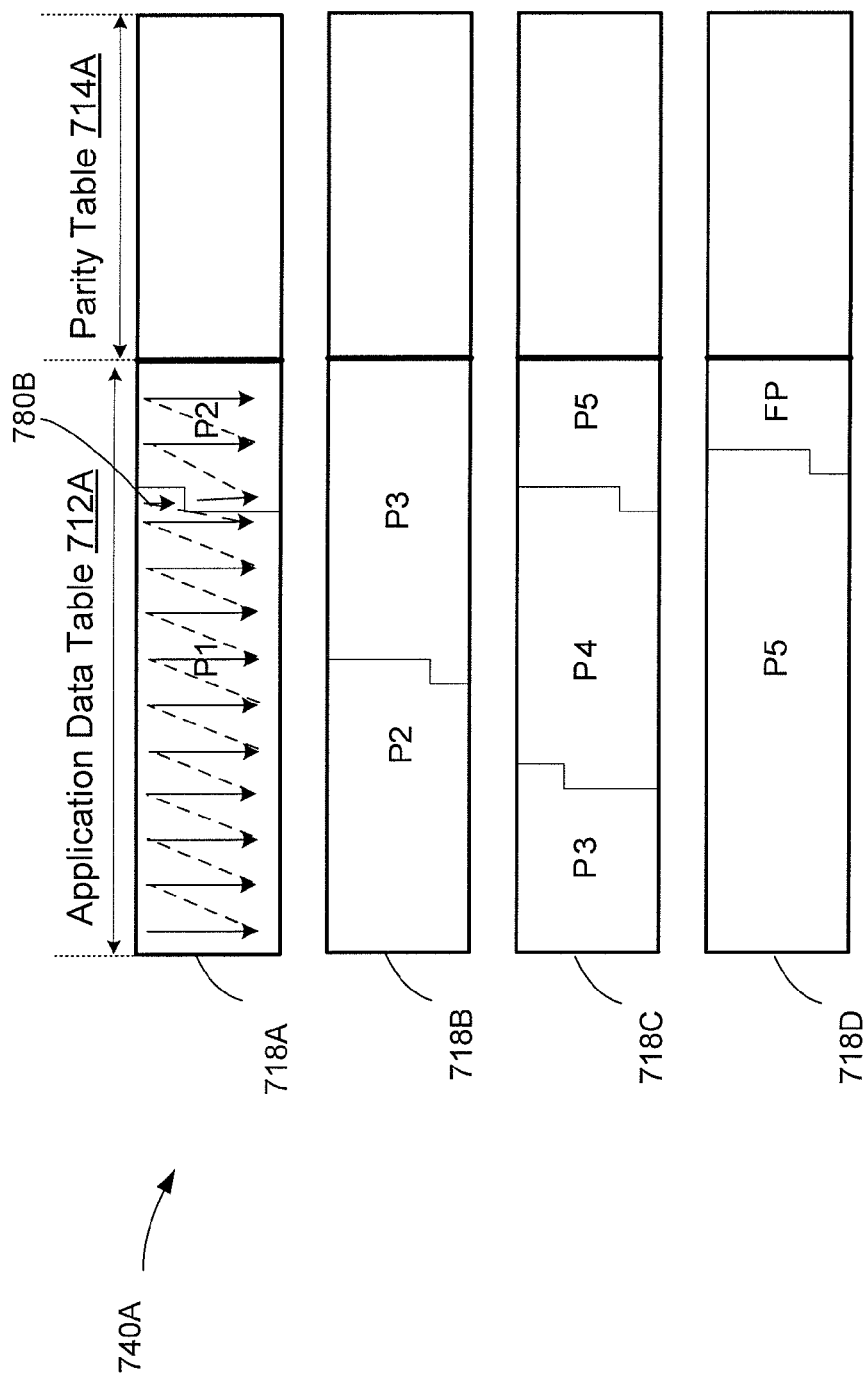
FIG. 7C depicts another block pattern for arranging packets in a Reed-Solomon table.

FIG. 7C depicts application data packets 705 inserted as packets P1-P5 into application data table 712A and, in particular, into blocks 718A-D, each of which includes one or more rows and one or more columns. For example, when writing into block 718A, the first three bytes of the received packet are written into the first column (e.g., the first three rows of the first column), and the next three bytes of the received packet are written into the second column, and so forth across block 718A. FIG. 7C also depicts that packet P1 does not completely fill block 718A (e.g., packet P1 partially fills column 780B). The two packets associated with that column 780B are considered fragments. FIG. 7C also depicts that the next packet (labeled P2) starts at column 780B. As such, the initial bytes of packet P2 are inserted into a column as a fragment. Moreover, packet P2 is inserted into block 718A and a portion of block 718B, and subsequent packets (e.g., packets P3-P5 ) are inserted into subsequent blocks 718B-D. Furthermore, FIG. 7C depicts a fill packet (labeled "FP") used to fill block 718D.

In some embodiments, message generator 716A may determine (and/or receive from framer 710A), for inclusion in the convergence sublayer IE message, information about the substreams of the current stream. In some embodiments, the convergence sublayer IE message is included in the first substream of a stream, and that convergence sublayer IE message includes information about all of the substreams of the streams. This information about the substreams may include pattern information representative of a pattern used to write the stream of packets into a data structure and packet boundary information representative of start locations of packets in the data structure. For example, the information may include outer coding mode information. The outer coding mode information is an example of pattern information representative of the pattern used to arrange packets in table 740A (e.g., whether the writing pattern is column-by-column, block, etc). Moreover, message generator 716A may determine when an Embedded MBS MAP (described further below) is being implemented, and include this determined information in a convergence sublayer IE message. Furthermore, message generator 716A may determine (and/or receive from framer 710A), for inclusion in the convergence sublayer IE message, the number of substreams in the current stream in the current time diversity interval using the outer coding mode specified by the convergence sublayer IE message. This number of substreams is equal to the number of substreams similarly specified by the LDC MBS MAP in an earlier time diversity interval or in the Embedded MBS MAP transmitted in an earlier time diversity interval (e.g., given an offset of two, two time diversity intervals earlier).

Message generator 716A may determine (and/or receive from framer 710A), for inclusion in the convergence sublayer IE message, the number (e.g., quantity) of packets in each of the substream of a given stream as well as other information, such where in the table those packets are located, and information to allow for header compression. For example, the number (e.g., quantity) of packets in each of the substreams of a given stream identifies the total number of packets transmitted in a given substream with the outer coding mode specified in the convergence sublayer IE message. In some embodiments, the total number (e.g., quantity) of packets in each of the substreams includes all possible control packets (e.g., convergence sublayer IE packets and Embedded MBS MAP IE packets), application data packets, fragmented packets, and possible fill packets.

The message generator 716A may include in the convergence sublayer IE message an indication of whether application packet cyclic redundancy check (CRC) is being used. If application packet CRC is being used, the last one or more bytes of each application packet extracted from the Reed-Solomon table 740A are the CRC. For example, when CRC-16 is used, the last two bytes of the application data packet are CRC-16 providing checksum bytes of the application data packet including all its headers. When CRC-32 is used, the last four bytes of the application data packet including all its headers are CRC-32 providing a checksum.

Message generator 716A may determine (and/or receive from framer 710A), for inclusion in the convergence sublayer IE message, a first packet indicator to identify the status of the first application packet of the substream. The first application packet may be, for example, the first application packet in the first substream of the stream transmitted after the convergence sublayer IE message and an embedded MBS MAP. The first packet indicator can be set to one or more predetermined values to identify whether a packet of a substream is a fragmented packet, an un-fragmented packet, a fill packet, and the like. For example, the first packet indicator may be set to the predetermined value of 0b00 to indicate that the first packet in a given substream is a complete, un-fragmented packet, the value 0b01 may be used to identify that first packet as a fragment, and the value 0b10 to indicate a fill packet.

Message generator 716A may determine (and/or receive from framer 710A), for inclusion in the convergence sublayer IE message, a last packet identifier to identify the status of the last packet of a given substream. The last packet identifier is set to one or more predetermined values to identify the status of the last packet of a given substream. For example, the last packet identifier may be set equal to the predetermined value 0b00 to identify that the last packet in the substream is a complete, an un-fragmented packet, a value of 0b01 to indicate that the last packet in the substream is a fragment, and a value of 0b10 to indicate that the last packet in the substream is a fill packet.

Message generator 716A may also determine (and/or receive from framer 710A), for inclusion in the convergence sublayer IE message a packet location index. The packet location index identifies the locations of packets within a data structure, such as tables 740A depicted in FIGS. 7B and 7C. In other words, for a given outer coding mode, such as column-by-column (FIG. 7B), block (FIG. 7C), and the like, the packet location index determines where in the table a packet is located. For example, given table 740A of FIG. 7B, the packet location index of the first byte of table 740A at FIG. 7B (which corresponds to the first column and first row) is 0 (or a binary representation of that value), and the location index of the second byte, which corresponds to the first column and second row, is 1, and subsequent bytes in the first column sequentially increment until the last row of table 740A. The location index then increments from the last row of the first column to the first row of the second column of table 740A, and so forth through the table. Referring again to table 740A at FIG. 7B, the start of packet P1 may have a packet location index of 0, and the start of packet P2 may have a packet location index of 167. The packet location index values thus uniquely identify locations in a table and thus the start and ending locations of packets (e.g., given a packet location index, the starting or ending location of a packet can be determined given the outer coding mode described above). These packet location index values are only for purposes of illustration.

The packet location index may also be used to identify locations within table 740A at FIG. 7C. Referring to FIG. 7C, given block 718A includes 13 columns and three rows per column, the location index may vary, for example, from 0 (which would correspond to the first column and first row of block 718A) to 38 (which would correspond to the last column and last row of block 718A), and 39 to 77 for block 718B, and so forth through the blocks 718C-D of FIG. 7C. As such, in some embodiments, the packet location index uniquely identifies a starting location for a packet in a given type of table (e.g., a table filled using column-by-column, block, or the like).

Regardless of whether packets are inserted column-by-column (e.g., FIG. 7B) or block (e.g., FIG. 7C), each of the rows of the Reed-Solomon table 740A can be read and then encoded to form Reed-Solomon codewords. Once determined, the Reed-Solomon codewords (including parity bits) can be inserted back into Reed-Solomon table 740A (including parity table 714A). The Reed Solomon code used for encoding may be systematic, meaning that the determined codeword comprises that original data followed by computed parity bits. Thus, in such embodiments, when inserting the computed codewords back into Reed-Solomon table 740A, only the parity table 714A portion of Reed-Solomon table 740A may change. It should be noted that although the present embodiments are discussed with reference to Reed Solomon error correction codes, it should be understood that in other embodiments other types of block codes may be used, such as, for example, LDPC (low density parity check) codes, BCH codes, etc. Moreover, in addition to using an outer code (e.g., using the Reed-Solomon code), other codes, such as a concatenated, inner code, may also be applied to the values of table 740. Furthermore, although the examples described herein describe a Reed-Solomon table and associated Reed-Solomon forward-error correction, other types of tables and error correction may be used as well. Moreover, the values (e.g., written bytes) of table 740A may be the actual data values or references to locations in memory where the data resides.

After encoding, framer 710A may read one or more values of the rows of Reed-Solomon table 740A and insert the read values into link-layer packets 795. In some case, the link-layer packets 795 are implemented as protocol data units (PDUs), which may include a header at the front of each PDU and a CRC (cyclic redundancy check) appended at the end of each PDU. Moreover, the PDUs may be associated with a stream including substreams. Furthermore, the PDUs may include the content, such as the convergence sublayer IE message inserted into the Reed-Solomon table before encoding using forward-error correction. In some embodiments, the convergence sublayer IE message is inserted into the Reed-Solomon table, such as table 740A, so that the message is the initial packet(s) (e.g., first packets) of a first substream of a stream of packets. For example, the message generator may insert the convergence sublayer IE message as packets P1 and P2 of FIG. 7C, which is then followed by packets P3 and so forth constituting application data packets for the first substream of the stream of packets. As such, when a client station achieves the synchronization, as described above, and decodes the convergence sublayer IE message, the client station can determine pattern information (e.g., how the packets were written and/or coded at table 740A) and packet boundary information (e.g., the start and/or end locations in table 740A).

Figure 7D:
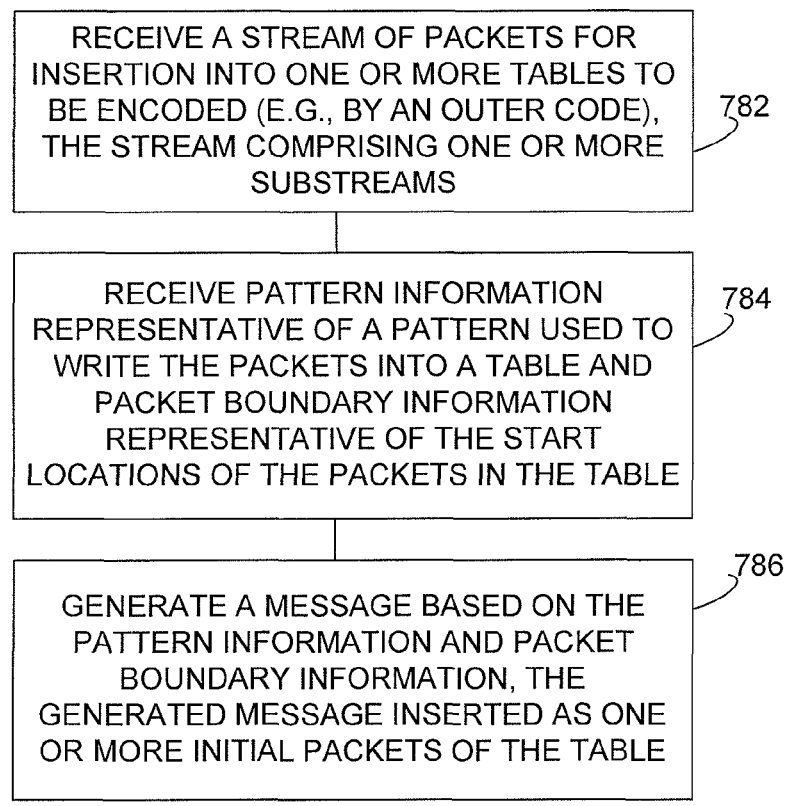
FIG. 7D depicts a process for generating a message based on pattern and packet boundary information related to packets arranged in a data structure, such as a Reed-Solomon table.

FIG. 7D depicts a process for generating a message, such as a convergence sublayer IE message. The description of this process will also refer to FIGS. 7A-7C.

At 782, one or more packets are received for insertion into a data structure, such as table 740A. For example, framer 710A may receive one or more packets, such as application data packets 705, for insertion into table 740A. Moreover, the packets may be associated with a stream comprising one or more substreams. In some embodiments, base station 110B (which is noted-above may be more typically be implemented as an multicast broadcast controller, such as an MBSC) may monitor (e.g., track, measure, and the like) one or more aspects of the received packets, such as which stream and substream a received packet is associated with. Moreover, the received packets may be inserted into table 740A as noted above. For example, the received packets may be inserted using in a column-by-column approach (e.g., FIG. 7B) or a block (e.g., FIG. 7C) approach. The table 740A may also be encoded using an outer code, such as a Reed-Solomon forward-error correction code, as described above, as well as other codes, such as an inner code.

At 784, message generator 716A may receive a pattern information representative of the pattern used to write the packets into the data structure and packet boundary information representative of the start locations and/or ending locations of the packets in the table. The above-described information included in the convergence sublayer IE message may be used to provide pattern information, boundary information, or a combination of both.

At 786, the message generator 716A may generate, based on the information received at 784, a message. The message, in some embodiments, is inserted into one or more initial packets of the table 740A. For example, the message, such as a convergence sublayer IE message, may be inserted as one or more initial packets of a first substream of a stream. Referring to FIG. 7C, the message generator may insert the convergence sublayer IE message as packets P1 and P2, wherein those packets constitute the first packets of a first substream of a stream of packets.

Once the generated message is inserted into a data structure, such as table 740A, table 740A is encoded using a forward-error correction code, as described above. The framer 710A then reads portions of table 740A and inserts the read portions into link-layer packets 795 (or, e.g., PDUs), some of which will correspond to the generated message, e.g., the convergence sublayer IE message. For example, a base station or, more typically an MBSC, may build link-layer packets and forwards the link-layer packets (including a time stamp on each packet) to one or more base stations through an ASN-GW. The base stations each buffer packets, and then each of the base stations, at the appropriate time, encodes and transmits the link-layer packets. Base station 110B may include a radio frequency (RF) front-end comprising an antenna to transmit an RF signal, such as a downlink to client station 114A. The RF front-end may also include other components, such as filters, analog-to-digital converters, an Inverse Fast Fourier Transform (IFFT) module, and a symbol mapper. These and other components may be used to modulate data, such as link-layer packets, onto the RF signal transmitted by base station 110B and carried by the RF signal. In some implementations, the base station 110B is compatible with IEEE 802.16 and transmits an RF signal configured as an OFDMA signal, including subcarriers carrying the link-layer packets. It should be noted that the ideas described herein are not limited to IEEE 802.16 systems or other wireless systems, but are applicable to any communication system.

Figure 7E:
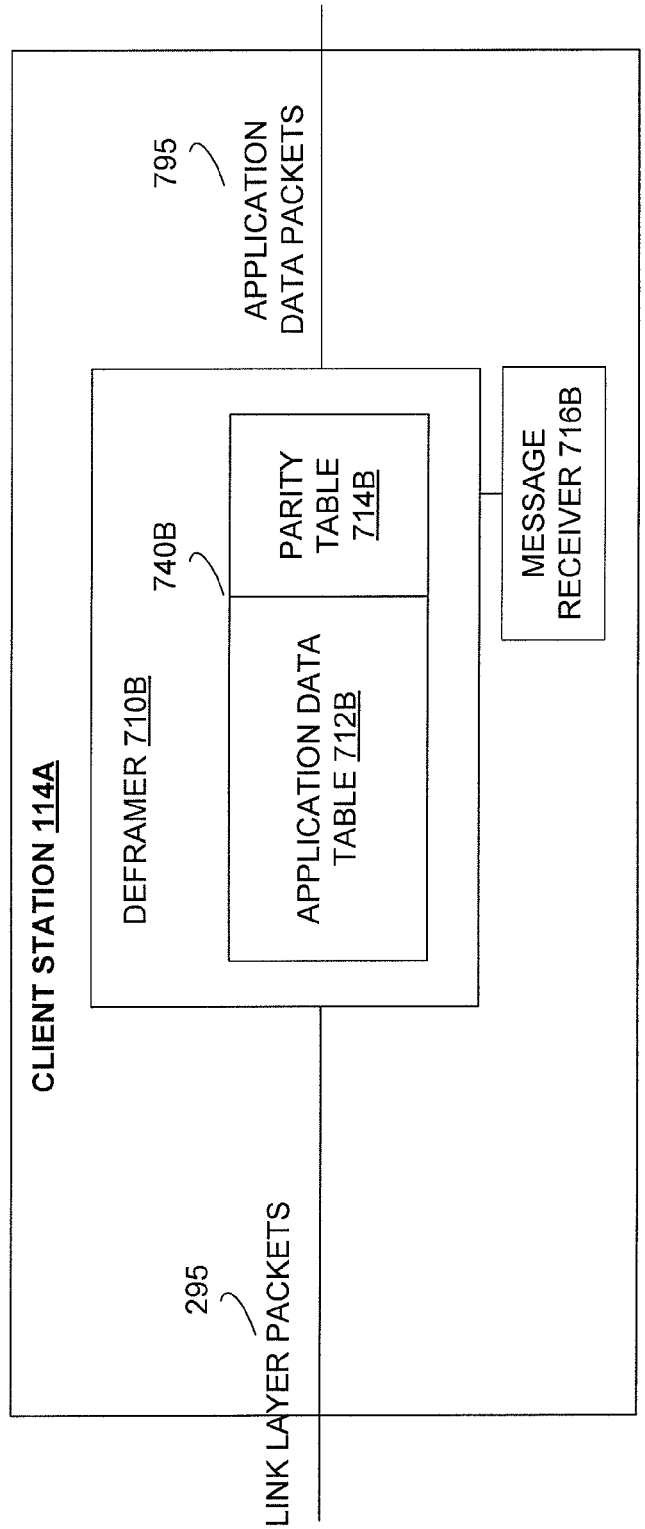
FIG. 7E depicts a client station configured to receive a message including pattern information and packet boundary information.

FIG. 7E depicts a client station 114A. Client station 114A includes a deframer 710B for arranging data, such as link-layer packets 295 received from base station 110B. Moreover, client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets for use at the client station. In some implementations, the client station 114A is compatible with IEEE 802.16 and receives an RF signal configured as an OFDMA signal carrying the link-layer packets. The description of FIGS. 7E and 7F assumes that network entry and the corresponding synchronization, as described above, have been achieved.

Client station 114A also includes a data structure, such as Reed-Solomon table 740B. For example, received link-layer packets 295 are inserted into the Reed-Solomon table 740B in the same manner that the packets were obtained from the Reed-Solomon table at base station 110B (e.g., by rows, columns, or a combination of the two). Since the client station 114A has performed a network entry and synchronization as described herein, the client station is configured to decode the received link-layer packets and/or PDUs (including removing any CRC applied to the PDUs, decoding any inner codes and/or outer codes used to provide forward-error correction). The inserted link-layer packets are then forward-error correction decoded using the same forward-error correction code used at the base station. After this decoding is performed, client station 114A can use the convergence sublayer IE message included as one of the decoded packets of table 740B to determine the location of packets and pattern for reading the packets from table 740B. The convergence sublayer IE enables the client station to read packets from table 740B using the same pattern (e.g., using a column-by-column basis, a block basis, etc.), while accounting for packet boundaries, such as starting locations, fragments, and fill (which is discarded rather than being provided to another component of client station 114A for processing).

Figure 7F:
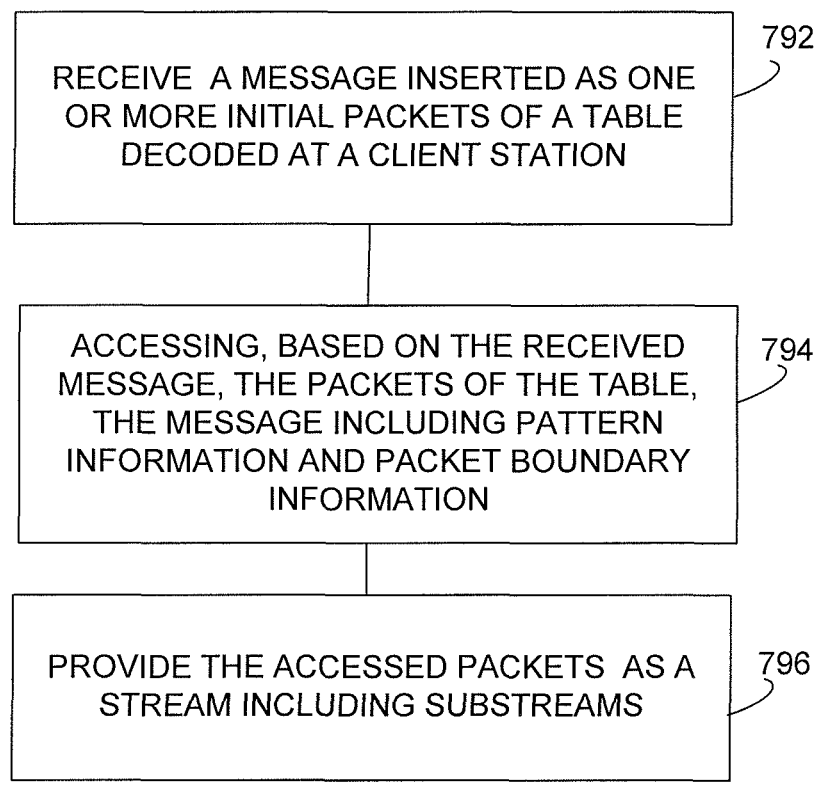
FIG. 7F depicts a process for accessing packets based on a received message including pattern and packet boundary information related to packets arranged in a data structure, such as a Reed-Solomon table.

FIG. 7F depicts a process for using a message, such as the convergence sublayer IE message, at client station 114A. The description of the process of FIG. 7F will also refer to FIG. 7E.

At 792, a message is received as one or more packets inserted into a data structure, such as table 740B. After client station 114A achieves the above-described synchronization, message receiver 716B is able to access a message included within the decoded packets of table 740B. For example, message receiver 716B may access a predetermined location in the packets of table 740B to access the convergence sublayer IE message. The predetermined location may be one of the initial packets of the first substream of a stream of packets (e.g., the transmitted and decoded representations of packets P1 and P2 at FIG. 7C). The convergence sublayer IE message can be used by the deframer 710B to read packets from table 740B using the same pattern (e.g., using a column-by-column basis or a block basis), while accounting for packet boundaries, such as starting locations, fragments, and fill packets discarded rather than being provided to another component of client station 114A.

At 794, the packets in table 740B can be accessed, based on the received message. For example, the deframer 710B accesses, based on the convergence sublayer IE message, the decoded application data packets of table 740B. Specifically, the convergence sublayer IE message enables the deframer 710B to determine how and where to read the packets using the packet and boundary information included in the convergence sublayer IE message. For example, the packet location index provides an indication of the packet boundaries of the packets in table 740B, and the outer code mode provides information on which pattern to use to read those packets from table 740B.

At 796, the accessed application data packets are provided as a stream including substreams. Moreover, the convergence sublayer IE message includes fragmentation information, so that the deframer 710B can determine precisely where a packet ends and where another begins within the table 740B and further includes fill information to enable any fill packets to be discarded rather than be provided to another component, such as an application for processing and presenting digital video broadcast television.

It should be noted that although the above-described embodiment was discussed with reference to a stream comprising a plurality of sub-streams, in embodiments, the streams need not be divided into sub-streams. For example, in an embodiment, the application data packets arriving over a particular time frame for a particular stream may use a single table 740A. Further, in such an embodiment, the convergence sublayer IE message in such an example, may be included in the first or first few packets of the table 740A, or for example, included in a different table.

Figure 8A:
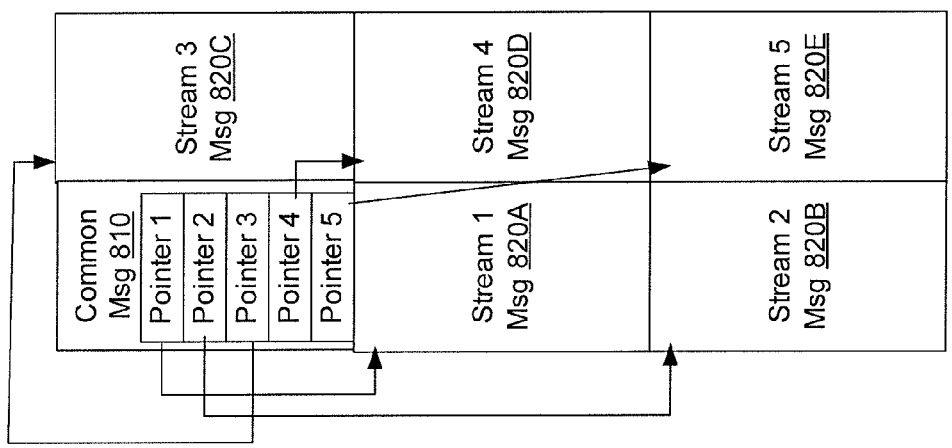
FIG. 8A depicts an exemplary structure of an LDC MBS MAP message.

In some implementations, the LDC MBS MAP includes messages as depicted at FIG. 8A. Referring to FIG. 8A, the LDC MBS MAP may be configured as message 800 including a common message 810 and one or more stream messages 820A-E.

The common message 810 includes generic overhead information for the MBS regions being defined by the LDC MBS MAP. In an embodiment, each MBS zone (e.g., a geographic area) may have unique MBS regions, and the common message of the LDC MBS MAP may include an identifier specifying to which MBS zone the LDC MBS MAP is related. For example, an MBS zone may be defined for the San Diego metro area and the MBS regions for this zone used to transmit local San Diego television stations. A different MBS zone, however, may be defined for the Los Angeles area and the MBS regions in the Los Angeles MBS zone used to broadcast data (e.g., local television, radio, or other data) particular to the Los Angeles zone. The MBS regions for these different MBS zones may be independent of each other. Moreover, in some implementations, a plurality of zones may occupy the same geographic area (e.g., a first zone for San Diego county and a second zone for the northern part of San Diego county). Or, for example, one MBS zone may define MBS regions for use in broadcasting one type of content or service (e.g., radio broadcast in San Diego county) and another MBS zone used for defining MBS regions carrying a different type of content of service (e.g., television broadcast in San Diego county). Each of these MBS zones may be identified with different zone identifiers (IDs), and each zone may utilize different timing, outer coding, and/or physical parameters. The association of a particular LDC MBS MAP with a MBS zone is indicated in the DCD message. Moreover, there may be multiple MBS zone descriptors in a DCD message, and each MBS zone descriptor may be for a different MBS zone and for a different LDC MBS MAP. In some implementations, different MBS zones in an area may be multiplexed in time or in different OFDMA frames.

In addition to identifying the MBS zone to which the LDC MBS MAP relates, the generic overhead information in the common message may further include one or more of the following: a size (e.g., number of OFDMA symbols) of the LDC MBS MAP in the next MBS region or in the next time diversity interval, a numbering system assigning numbers to the OFDMA symbols of the MBS regions and assigning widths to the MBS regions, streams available in a zone, and one or more pointers to the location of one or more stream messages 820A-820E in the LDC MBS MAP. The stream messages 820A-820E are described further below. In some implementations, a cyclic redundancy check (CRC) is appended to the common message to permit the client stations to detect whether a received common message is in error.

The pointers may point to one or more stream messages 820A-E. Each stream message 820A-E may define a corresponding stream (as well as the stream's substreams, if any) carried in the MBS region. Thus, in an embodiment, a client station desiring to receive a particular stream (e.g., CNN television) may obtain the information for receiving and decoding the desired stream by simply retrieving and decoding the common message 810 and the stream message (e.g., 820C) corresponding to the particular stream the client station desires to receive.

Each stream carried in an MBS region may be identified by a unique stream identifier (ID), and the common message may store each pointer in conjunction with the stream ID that identifies messages corresponding to the stream. In an embodiment, the pointers may simply be descriptions of the lengths of each stream message. Thus, a client station desiring to obtain a particular stream message may simply add up the lengths of the common message and the stream messages occurring prior to the desired stream message to determine the location of the desired stream message. For example, if a client device desires a particular stream, the client station may search the common message for the stream ID corresponding to the desired stream. For exemplary purposes, assume that the stream ID is the third stream ID located in the common message (i.e., the $3^{rd}$ pointer). The client station may, in this example, then simply add the lengths of the common message and the first two stream messages as defined in the common message to determine the location of the $3^{rd}$ stream message.

As noted above, in an embodiment each stream may comprise one or more substreams. Moreover, each stream message 820A-E may include information describing each of the substreams of the stream. This information describing each substream may be included in one or more substream descriptors included in the stream message (e.g., each substream may have a corresponding substream descriptor). The substream descriptors may each include one or more of the following: timing information 252A, outer coding information 252B, physical information 252C, and the like (as described above). For example, the timing information 252A may define the location(s) in the MBS region(s) that are used for transmitting the substream, the outer coding information may define the error control mechanism (e.g., the Reed Solomon parameters used for encoding the substream), if any, used for the substream, and the physical information may define the modulation and coding scheme used for transmitting the substream. In some embodiments, a substream includes one or more packets, each of which uses the same (or substantially the same) modulation and coding scheme, outer coding, inner coding, and the like.

By using the above LDC MBS MAP structure of FIG. 8A, a client station can decode only the common message 810 and decode only the stream messages for the streams of interest. For example, if a client station is only interested in stream 3 (e.g., associated with a 24-hour news service), the client station decodes the common message 810 of the LDC MBS MAP, reads a pointer to enable the client to only decode the stream 3 message 820C. The stream 3 message 820C may include sufficient information (e.g., timing information 252A, physical information 252C, outer coding information 252B, and the like) to decode the substreams of stream 3. As such, the client station may still be able to obtain all the information regarding a desired stream from an LDC MBS MAP even when there are errors, such as forward-error correction block (FEC) errors, in portions of the LDC MBS MAP which are not associated with the desired stream. For example, if a client station is interested in decoding streams 1 and 3, then the client station need only decode the common message 810, stream 1 message 820A and stream 3 message 820C. Thus, if there are FEC block errors that cause other stream messages (i.e., other than the desired streams) to become unusable, the client station may still be able to receive the information required from the LDC MBS MAP to decode the desired stream because the common message 810 and the stream messages 820A and 820C are received without error.

Moreover, the LDC MBS MAP structure of FIG. 8A may reduce the quantity of times the LDC MBS MAP is transmitted in a given time diversity interval to achieve a desired operating point (e.g., error rate). By reducing the quantity of times the LDC MBS MAP is sent in a given time diversity interval, overall throughput of the system may be increased. Furthermore, the receiver may also receive different parts of the message 800 from a plurality of different LDC MBS MAPs in the same TDI. For example, if the common message 810 is received in the first LDC MBS MAP of the TDI and stream message 820B is received with error in the first try, the receiver may attempt to receive stream message 820B only in the next LDC MBS MAP of the same TDI.

In some embodiments, the streams (or substreams) carried in an MBS region may additionally include embedded MAP information that the client station may use to locate and decode a stream, without having to decode the LDC MBS MAP. For example, in an embodiment, a first packet of a first substream of a stream may be used to carry an Embedded MBS MAP that defines the location and encoding used for transmitting the stream. That is, this Embedded MBS MAP may include information sufficient for the client station to decode the stream without the need for the client station to also decode the LDC MBS MAP. In other words, the Embedded MBS MAP may include a subset of the information carried in the LDC MBS MAP that is specific to the particular stream.

Figure 8B:
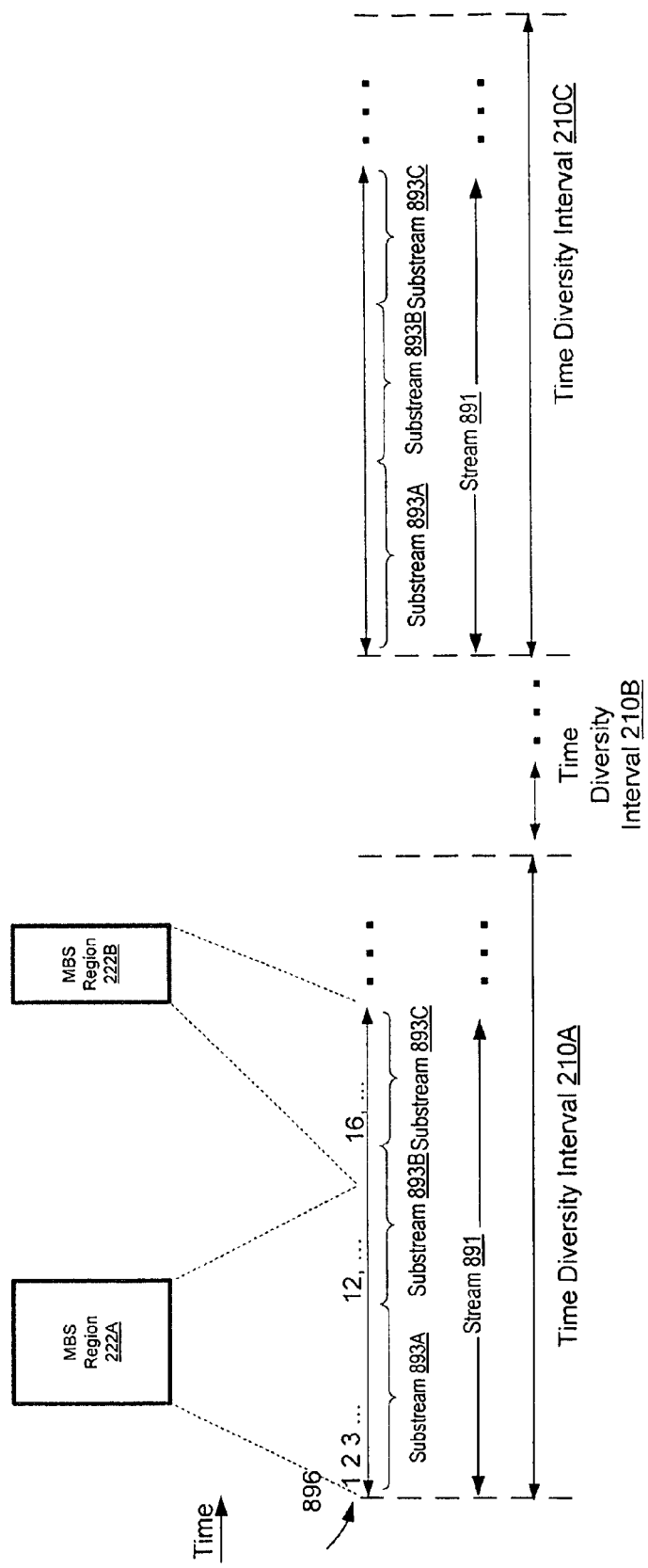
FIG. 8B depicts streams and substreams carried within one or more MBS regions.
Figure 9:
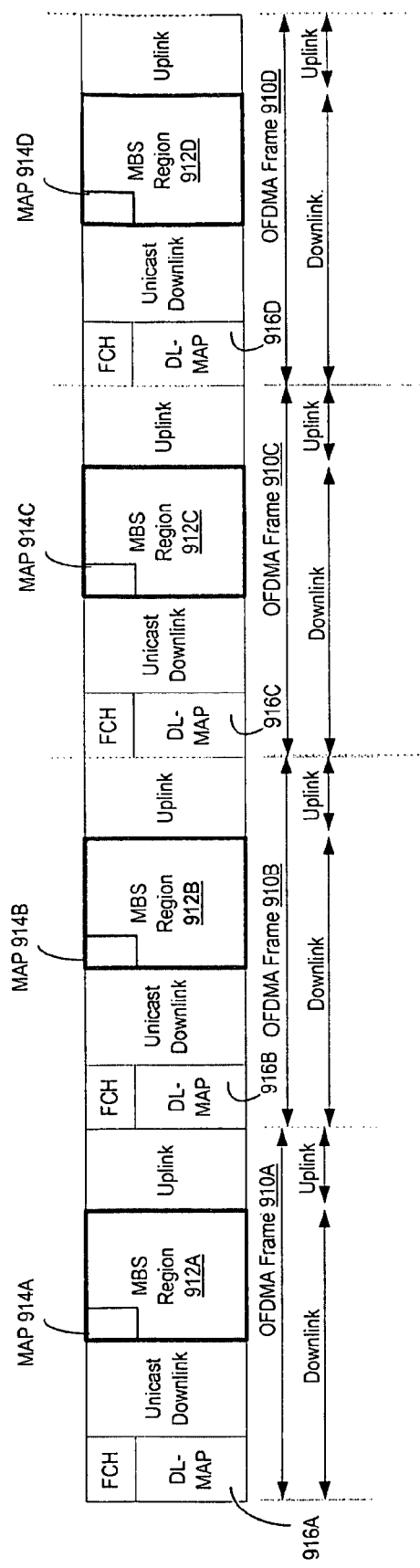
FIG. 9 depicts an example of an MBS MAP message as defined by IEEE 802.16.

FIG. 8B depicts the MBS regions 222A-B depicted at FIG. 2A. However, FIG. 8B further depicts a stream 891, which further includes substreams 893A-C and a stream 891. The first packet of substream 893A may include an Embedded MBS MAP. In an embodiment, the Embedded MBS MAP has a relevance of two meaning that the Embedded MBS MAP defines the location and encoding of the stream (including its substreams) in the time diversity interval sent two time diversity intervals after the current time diversity interval (i.e., the time diversity interval immediately following the immediately following time diversity interval). For example, given a relevance of two, the Embedded MBS MAP defines the location and encoding of the stream 891 including substreams 893A-C of time diversity interval 210C. Although the previous example used a relevance of two, in other embodiments, the Embedded MBS MAP may have a different relevance.

Moreover, as the first substream 893A of a stream carries relatively more important data, the first substream 893A may, in some implementations, use more robust error correction, modulation, and encoding when compared to other substreams 893B-C. As such, the risk of loss to the first packet of the first substream is minimized.

Once a client station has synchronized and obtained a particular stream, as described above with respect to processes 500 and 600, the client station may read the first packet of the first substream to determine how (and where) to read the substreams in a future, subsequent time diversity interval (e.g., the $2^{nd}$ time diversity interval after the current time diversity interval). When the next time diversity interval is received, another first packet in the first substream is used to determine how (and where) to again read the substreams of yet another, subsequent time diversity interval, and so forth. Because in the present embodiment, the Embedded MBS MAP includes sufficient information to receive and decode the stream of interest, the client station need not obtain and decode the LDC MBS MAP to receive and decode the stream of interest.

In an embodiment, the Embedded MBS MAP has a relevance of two, the LDC MBS MAP has a relevance of one, and the MBS MAP IE in the DL-MAP has a relevance of 0 (meaning its information describing the width of the LDC MBS MAPs describes the LDC MBS MAPs in the same time diversity interval as the DL-MAP.) For explanatory purposes the below example will refer to 3 consecutive time diversity intervals referred to as TDI 1, TDI 2, and TDI 3. Thus, in operation, if the Embedded MBS MAP in TDI 1 is received in error (e.g., as indicated by a CRC included in the Embedded MBS MAP), the client station may then retrieve and decode the LDC MBS MAP in the next TDI (TDI 2) to obtain the information describing the stream in the third TDI (TDI 3).

Once a particular stream is obtained by a client station, the client station may primarily use the Embedded MBS MAPs for decoding the stream. If, however, the client station desires to change streams (e.g., change channels), the client station may then obtain the LDC MBS MAP to obtain the information describing the new stream of interest. Although the above describes the Embedded MBS MAP as included in the first packet of a first substream, the Embedded MBS MAP may be located at any other location (e.g., a predetermined location) within the stream as well.

In some embodiments, the embedded MAP message may include one or more of the following: a length parameter identifying the total length of the embedded MAP message (e.g., in bytes); numbering system information, as described above; the size (in number of OFDMA symbols) of the LDC MBS MAP in the second, subsequent (if a relevance of 2) time diversity interval (within a zone); the number of substreams in the current stream; substream descriptions, such as timing information 252A, outer coding information 252B, physical information 252C; and any other information used to describe the streams and substreams.

The subject matter described herein may be embodied in systems, apparatus, methods, and/or articles depending on the desired configuration. In particular, various implementations of the subject matter described, such as the components of base stations, client stations, macrodiversity controller, and processes described herein, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of base station 110B, client station 114A, and aspects of processes described herein may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed is:

1. A method of operating a base station, the method comprising:
    a plurality of time diversity intervals including one or more frames;
    designating at least one of a plurality of data regions of a first frame in a first time diversity interval as a first broadcast data region;
    inserting, into the first broadcast data region a map, the map comprising information to identify a second broadcast data region of a second frame in a subsequent second time diversity interval, wherein the second broadcast data region includes only Multicast and Broadcast Service (MBS) data, and wherein the map is periodically located in the first time diversity interval but not in every frame of the first time diversity interval; and
    transmitting the plurality of data regions to one or more client stations using macrodiversity in synchronicity with at least one other base station.

2. The method of claim 1 further comprising:
    inserting a message into at least one of the plurality of data regions, the message including pattern information and packet boundary information, the pattern information representative of a pattern used to write a plurality of packets into the at least one of the plurality of data regions and the packet boundary information representative of start locations of packets in the at least one of the plurality of data regions.

3. The method of claim 1 further comprising:
    including in the map information a size of the second broadcast data region.

4. The method of claim 3, wherein including further comprises:
    using, as the size of the second broadcast data region, a quantity of orthogonal frequency division multiple access (OFDMA) symbols within an OFDMA frame, the size remaining constant within the time diversity interval.

5. The method of claim 1 further comprising:
    inserting, into one of the plurality of data regions, a packet in a sub stream of a stream of packets, the packet including an embedded MAP, the embedded MAP enabling the stream of packets to be decoded in a data region other than the one data region including the packet; and
    providing the inserted packet for transmission in the one of the plurality of data regions.

6. The method of claim 1 further comprising:
    configuring the map so that when the map is received by a client station the client station decodes the plurality of data regions without having to decode a downlink (DL) map transmitted, using non-macrodiversity, in orthogonal frequency division multiple access (OFDMA) frames where the plurality of data regions are located.

7. The method of claim 1, wherein transmitting further comprises:
    the time diversity intervals comprising one or more orthogonal frequency division multiple access (OFDMA) frames.

8. The method of claim 1, wherein each of the plurality of data regions is included in a data frame comprising a plurality of symbols, and wherein a message specifies a starting symbol of the plurality of symbols within each of a subset of the data frames for inserting the map, and wherein the message specifying the subset of symbols is included within the data frame but not within one of the plurality of data regions.

9. The method of claim 1, wherein inserting further comprises:
    using, as the information one or more of the following: timing information describing one or more streams of packets, outer coding information describing a forward-error correction coding used on the packets, and inner coding information describing a modulation and coding scheme used during transmission.

10. The method of claim 1 wherein the transmitting is such that one of the at least one client stations can decode the plurality of data regions without having to decode a downlink (DL) map transmitted using non-macrodiversity.

11. A method of operating a client station, the method comprising:
    receiving one or more frames in a plurality of time diversity intervals using macrodiversity in synchronicity with at least one other base station;
    receiving a frame in a first time diversity interval comprising a first plurality of data regions comprising a first broadcast data region comprising a map, wherein the map is periodically located in the first time diversity interval but not in every frame of the first time diversity interval;
    receiving a second frame in a subsequent second time diversity interval comprising a second plurality of data regions comprising a second broadcast data region, wherein the second broadcast data region includes only Multicast and Broadcast Service (MBS) data; and identifying the second broadcast data region of the second plurality of data regions of the second frame using the map.

12. The method of claim 11 further comprising:
receiving a message included in at least one of the second plurality of data regions of the frame, the message including pattern information and packet boundary information, the pattern information representative of a pattern used to write a plurality of packets into the at least one data region and the packet boundary information representative of start locations of packets in the at least one data region.

13. The method of claim 11, wherein the map includes information representing a size of the second broadcast data region included in the second frame.

14. The method of claim 11, wherein receiving the second plurality of data regions of the second frame further comprises:
decoding the second plurality of data regions of the second frame based on the map, without having to decode a downlink (DL) map received using non-macrodiversity.

15. The method of claim 11, wherein each of the plurality of data regions is included in a data frame comprising a plurality of symbols, and wherein a message specifies a starting symbol of the plurality of symbols within each of a subset of the data frames in which the first and second maps are located, and wherein the message specifying the subset of symbols is included within the data frame but not within one of the plurality of data regions.

16. The method of claim 11, wherein receiving the map further comprises:
using, as the map, one or more of the following: timing information describing one or more streams of packets, outer coding information describing a forward-error correction coding used on the packets included in the second plurality of data regions, and inner coding information describing a modulation and coding scheme used during transmission.

17. A method of operating a base station, the method comprising:
inserting a plurality of packets into a plurality of data regions;
inserting, into one of the data regions of the plurality of data regions, a message including a common message and one or more stream messages identified by a stream identifier (ID), wherein the common message may store a pointer for the one or more stream messages describing a length of each stream message in conjunction with the stream ID such that the common message associated with the one or more stream messages enables accessing one of the stream messages by accessing the common message without accessing the other stream messages; and
transmitting the one data region including the message for transmission to one or more client stations, wherein a location of a particular stream message can be determined by adding up the lengths of the common message and the stream messages occurring prior to the particular stream message.

18. The method of claim 17 further comprising:
inserting a message into at least one of the data regions, the message including pattern information and packet boundary information, the pattern information representative of a pattern used to write a plurality of packets into the at least one data region and the packet boundary information representative of start locations of packets in the at least one data region.

19. The method of claim 17 further comprising:
including, within the common message, an identifier indicating a zone associated with the common message.

20. The method of claim 17 further comprising:
including, within the common message, one or more of the following: a size of a map in another data region other than the one data region including the common message; a numbering system assigning numbers to the symbols of the data regions and assigning widths to the data regions; available streams in a zone, and one or more pointers to associate the common message to locations of stream messages.

* * * * *